(12) United States Patent
Noda et al.

(10) Patent No.: US 8,421,940 B2
(45) Date of Patent: Apr. 16, 2013

(54) DISPLAY DEVICE AND MANUFACTURING METHOD THEREOF

(75) Inventors: Takeshi Noda, Mobara (JP); Takuo Kaitoh, Mobara (JP); Hidekazu Miyake, Mobara (JP); Takahiro Kamo, Shibuya (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 885 days.

(21) Appl. No.: 12/405,396

(22) Filed: Mar. 17, 2009

(65) Prior Publication Data

US 2009/0230397 A1 Sep. 17, 2009

(30) Foreign Application Priority Data

Mar. 17, 2008 (JP) ................................. 2008-067974

(51) Int. Cl.
*G02F 1/136* (2006.01)

(52) U.S. Cl.
USPC ............................................. 349/43; 349/42

(58) Field of Classification Search .................. None
See application file for complete search history.

(56) References Cited

U.S. PATENT DOCUMENTS 7,247,882 B2 * 7/2007 Yamazaki et al. .............. 257/72

FOREIGN PATENT DOCUMENTS

JP 05-55570 3/1993

* cited by examiner

*Primary Examiner* — Sarah Hahm
(74) *Attorney, Agent, or Firm* — Antonelli, Terry, Stout & Kraus, LLP.

(57) ABSTRACT

A display device includes a TFT substrate in which a plurality of first TFT elements each having an active layer of an amorphous semiconductor and a plurality of second TFT elements each having an active layer of a polycrystalline semiconductor are disposed on a surface of an insulating substrate, wherein the first TFT element and the second TFT element each have a structure with a gate electrode, a gate insulating film, and the active layer stacked in this order on the surface of the insulating substrate and a source electrode and a drain electrode both connected to the active layer via a contact layer above the active layer, and the active layer of the second TFT element has a thickness of more than 60 nm in a position where the contact layer is stacked.

8 Claims, 28 Drawing Sheets

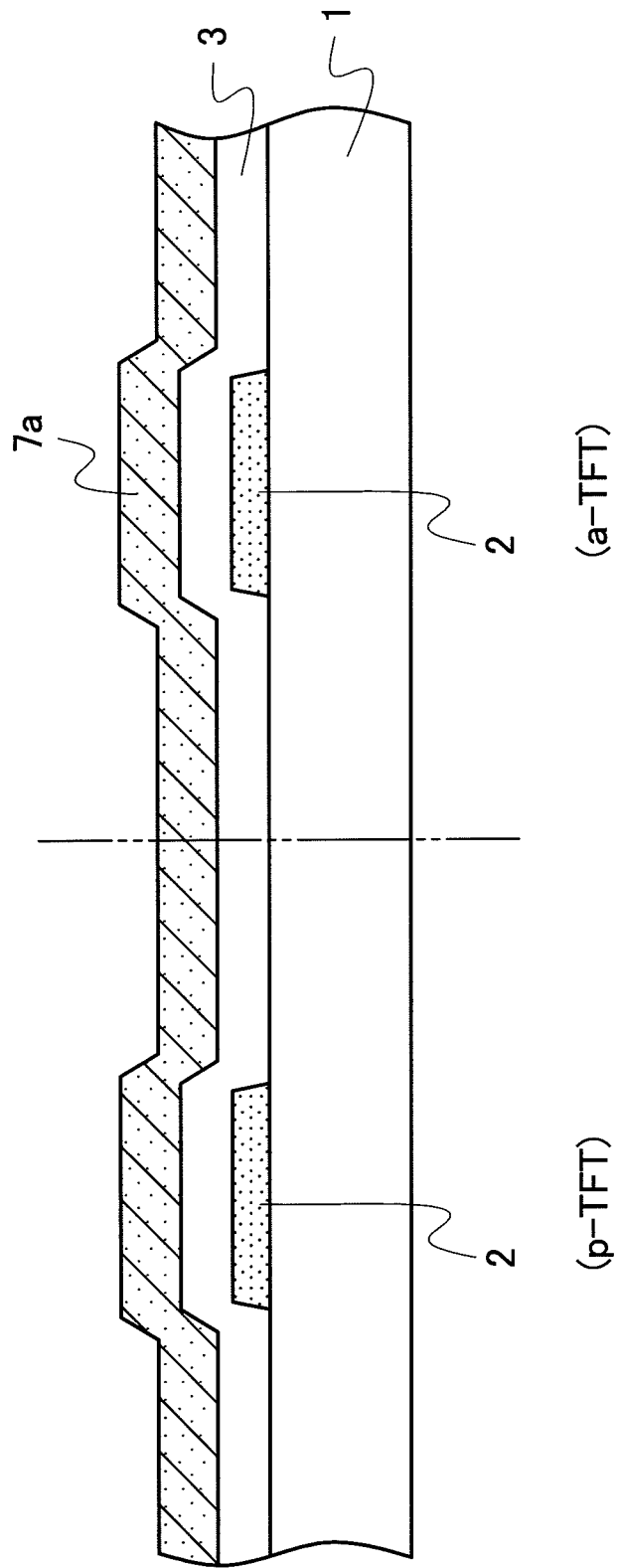

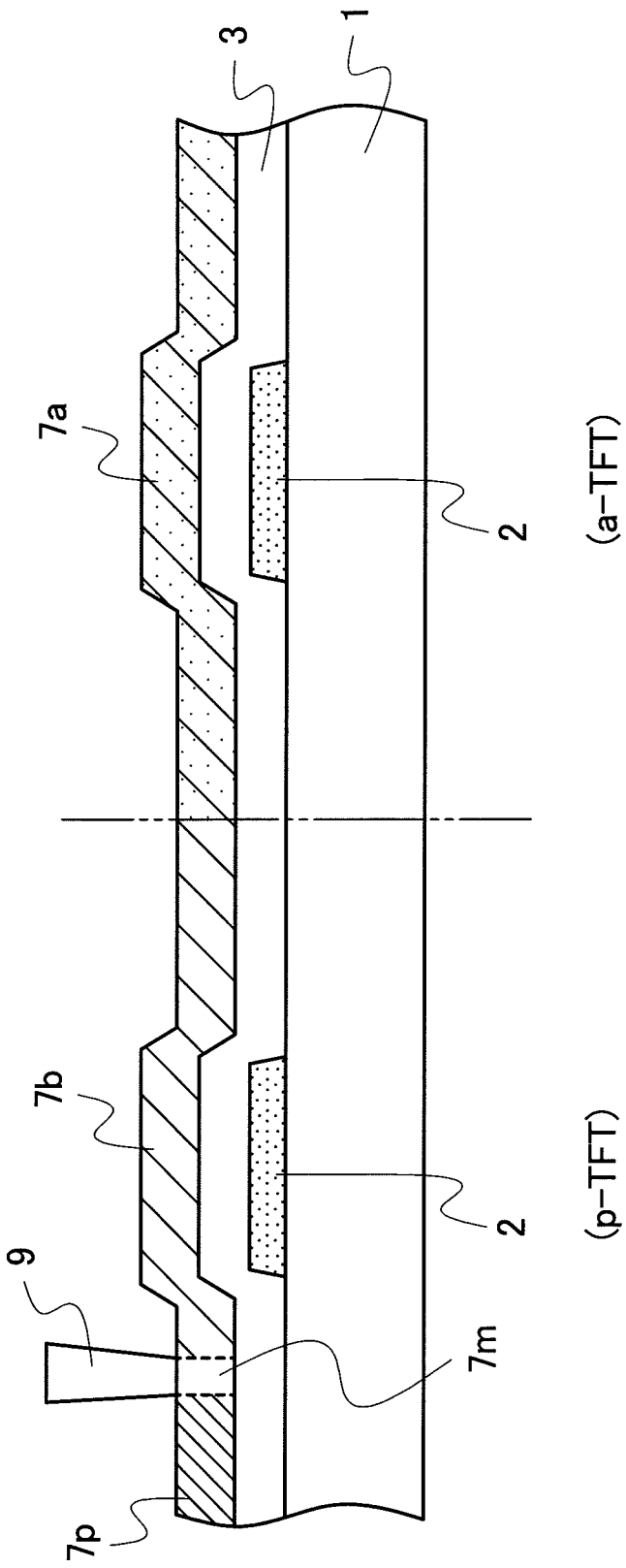

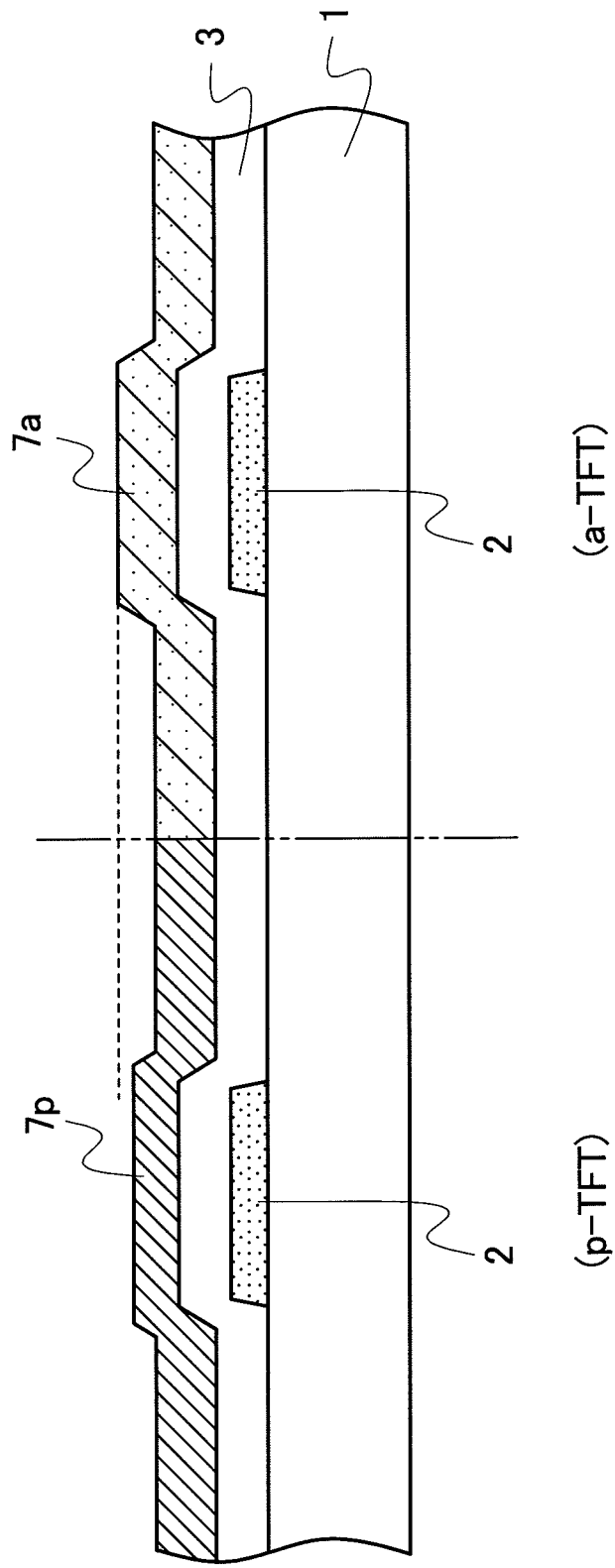

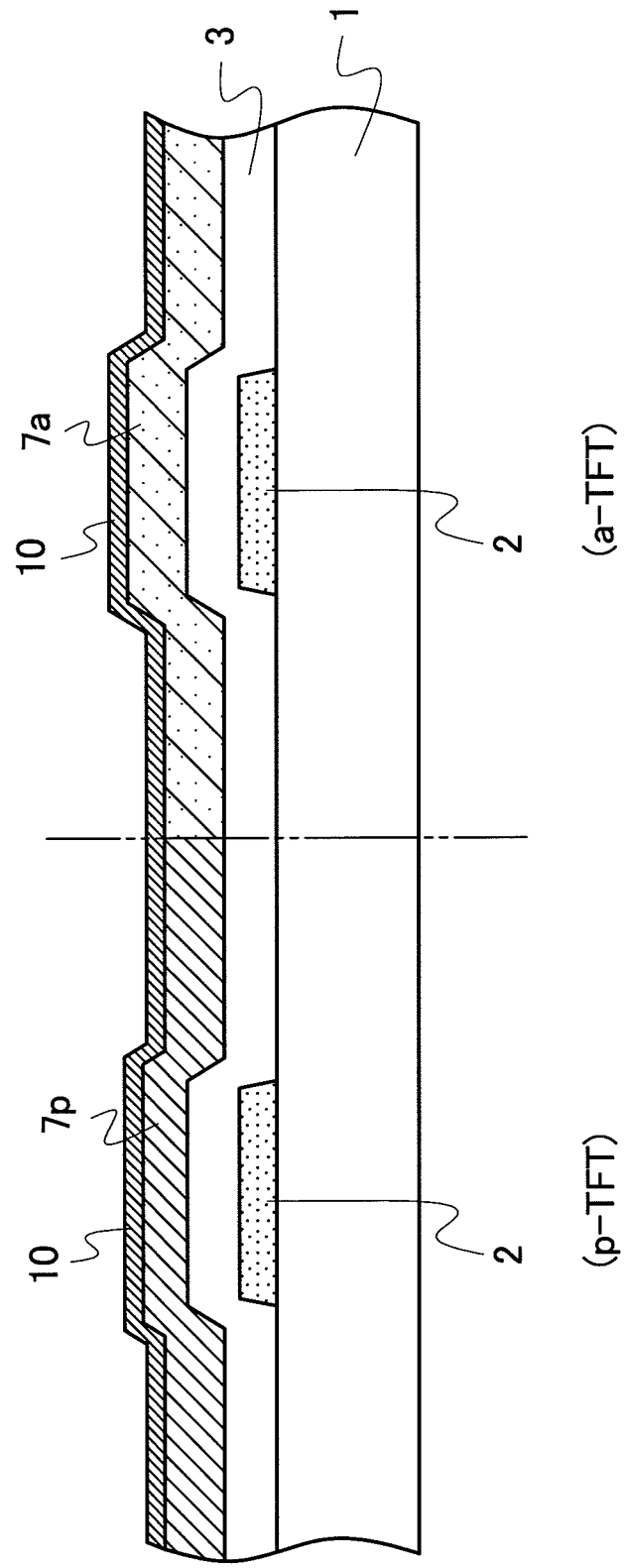

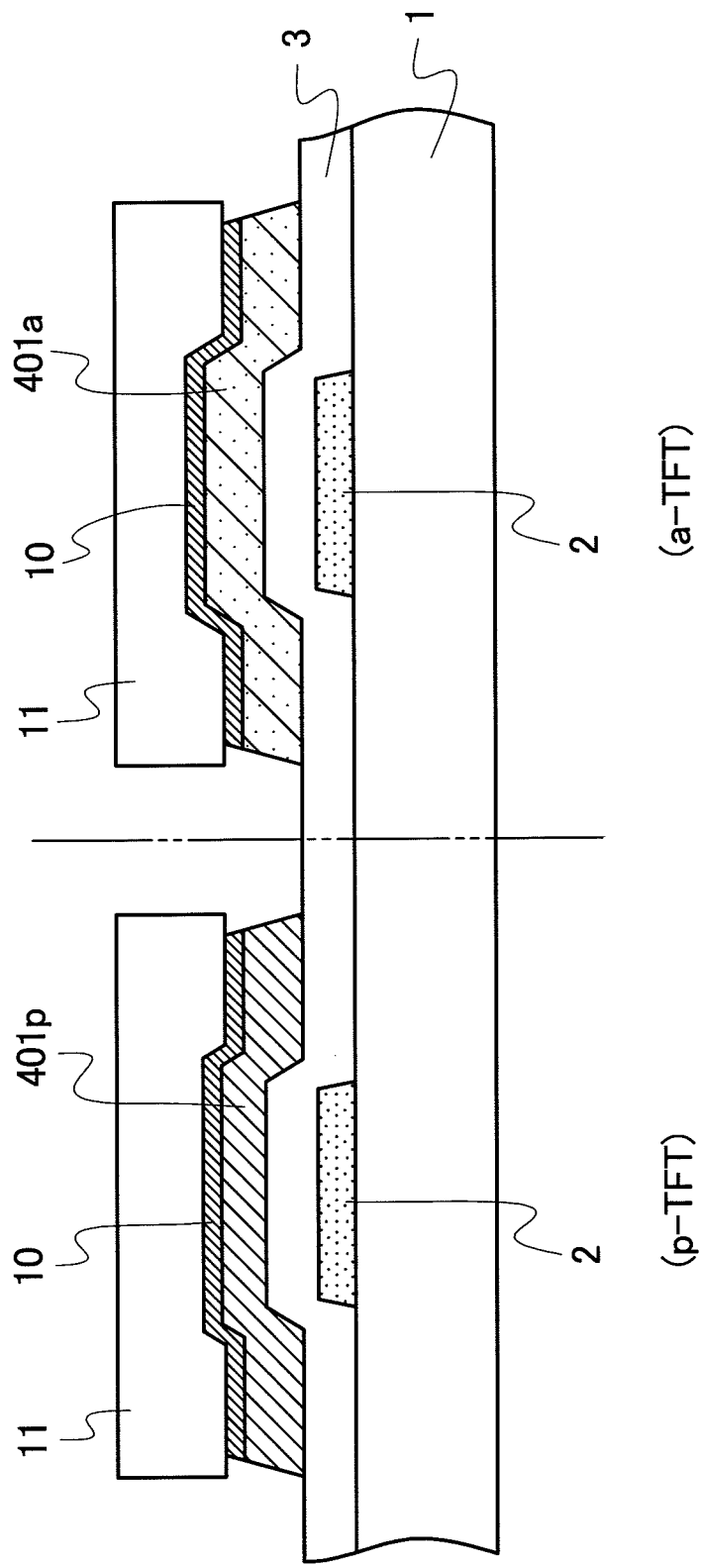

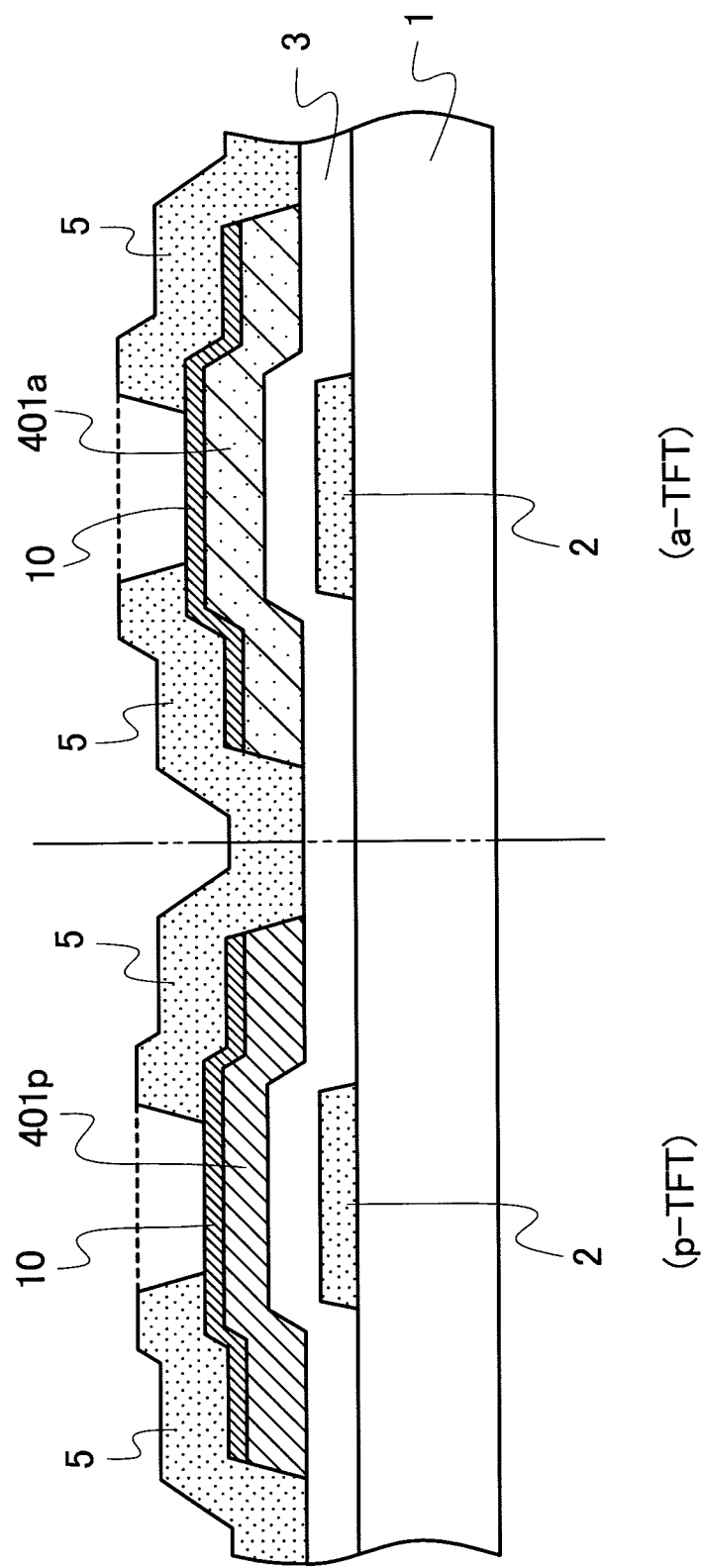

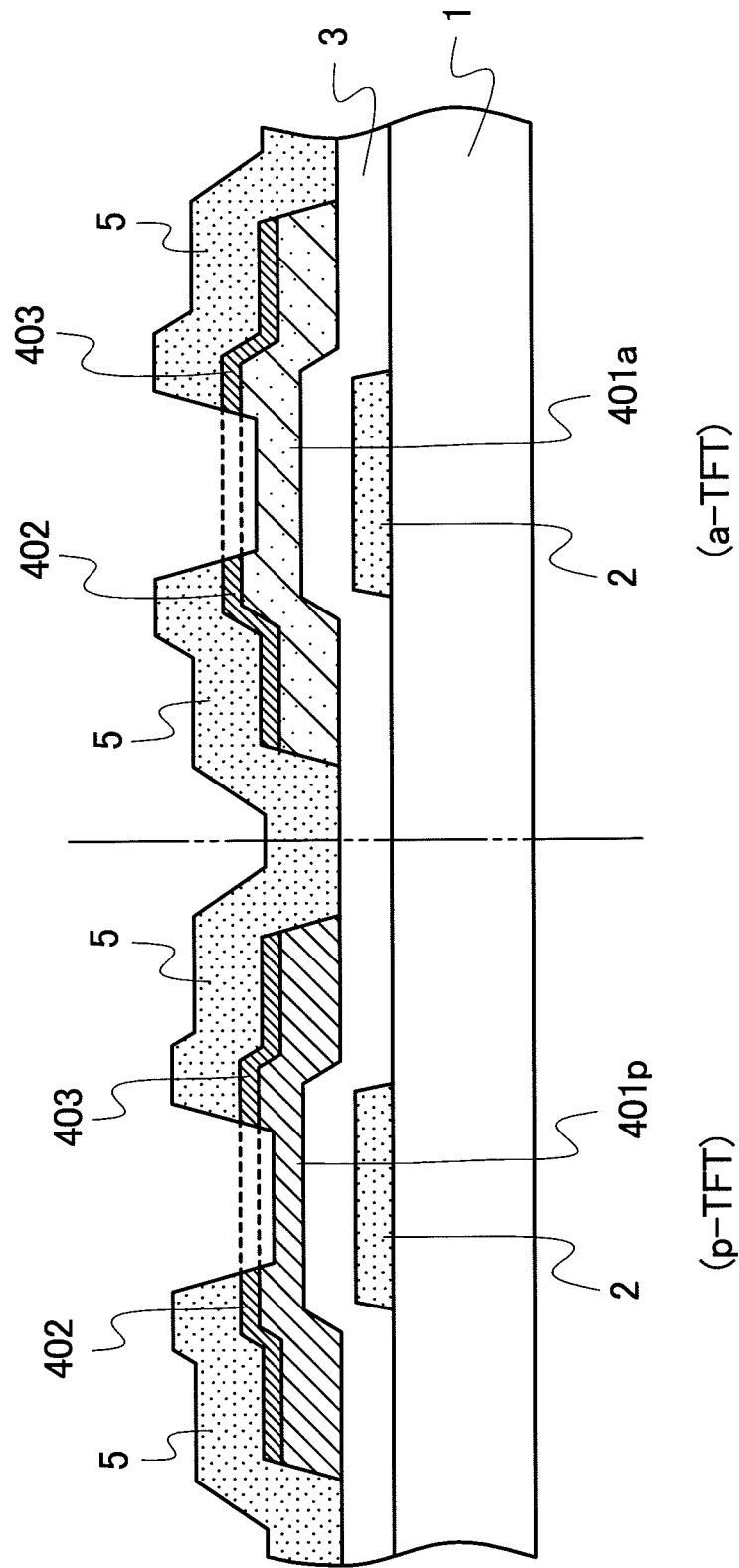

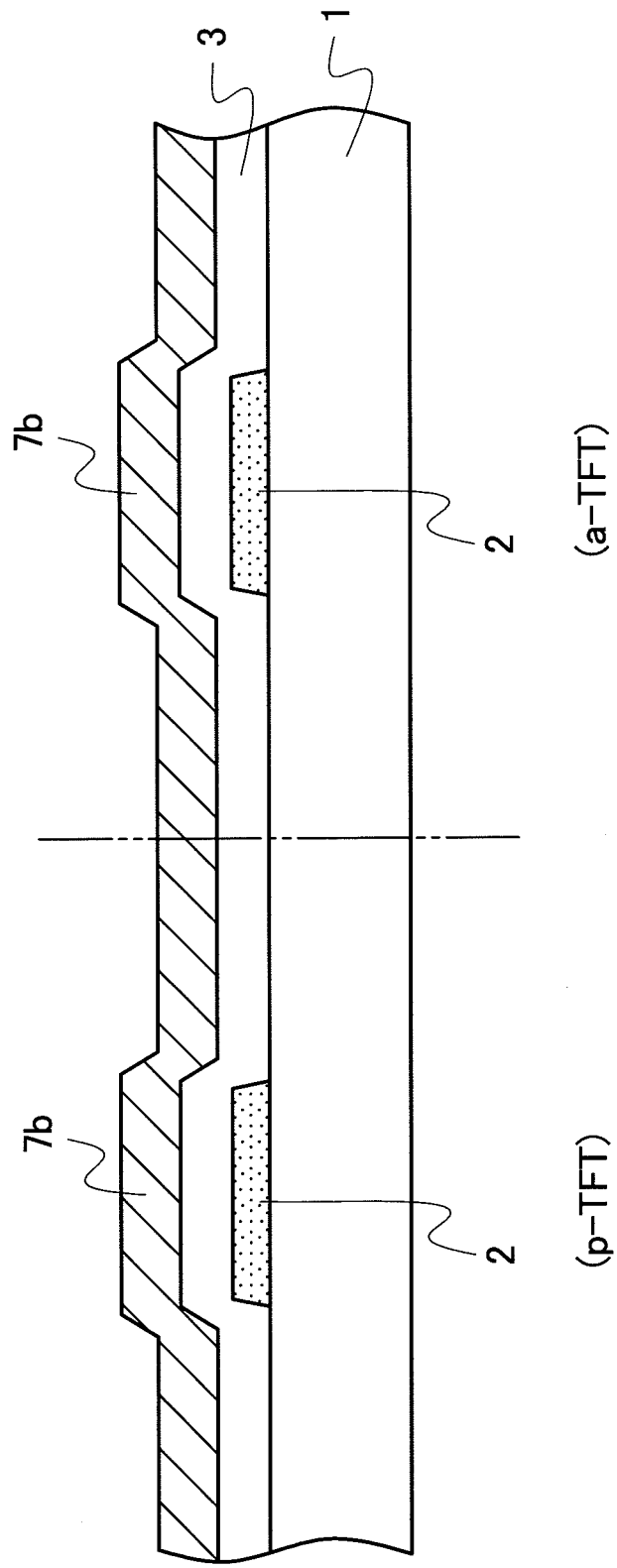

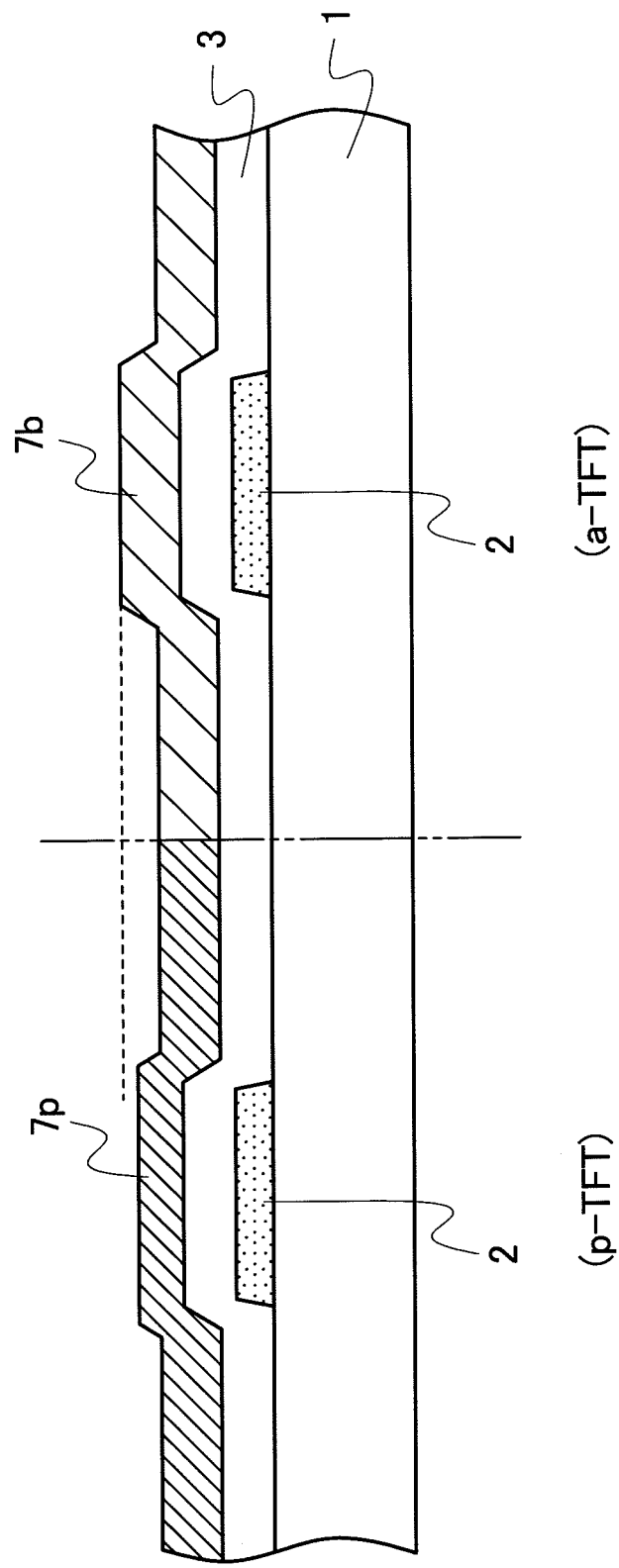

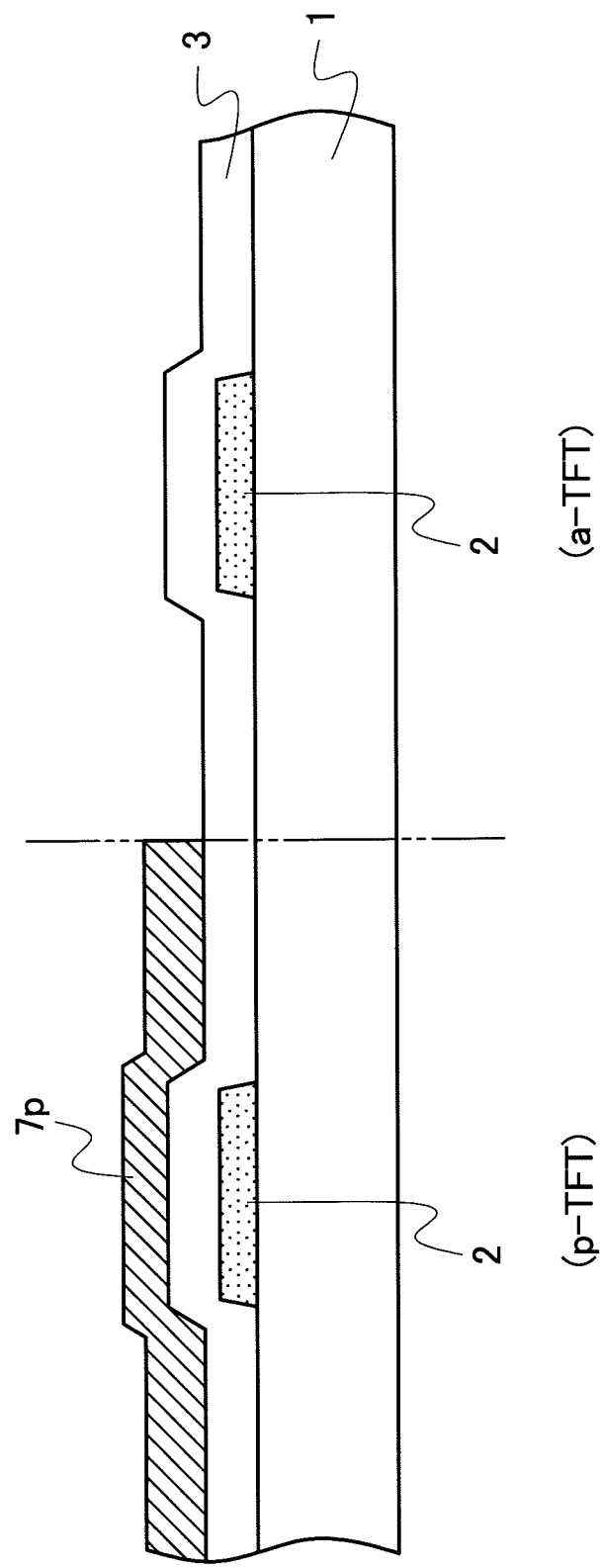

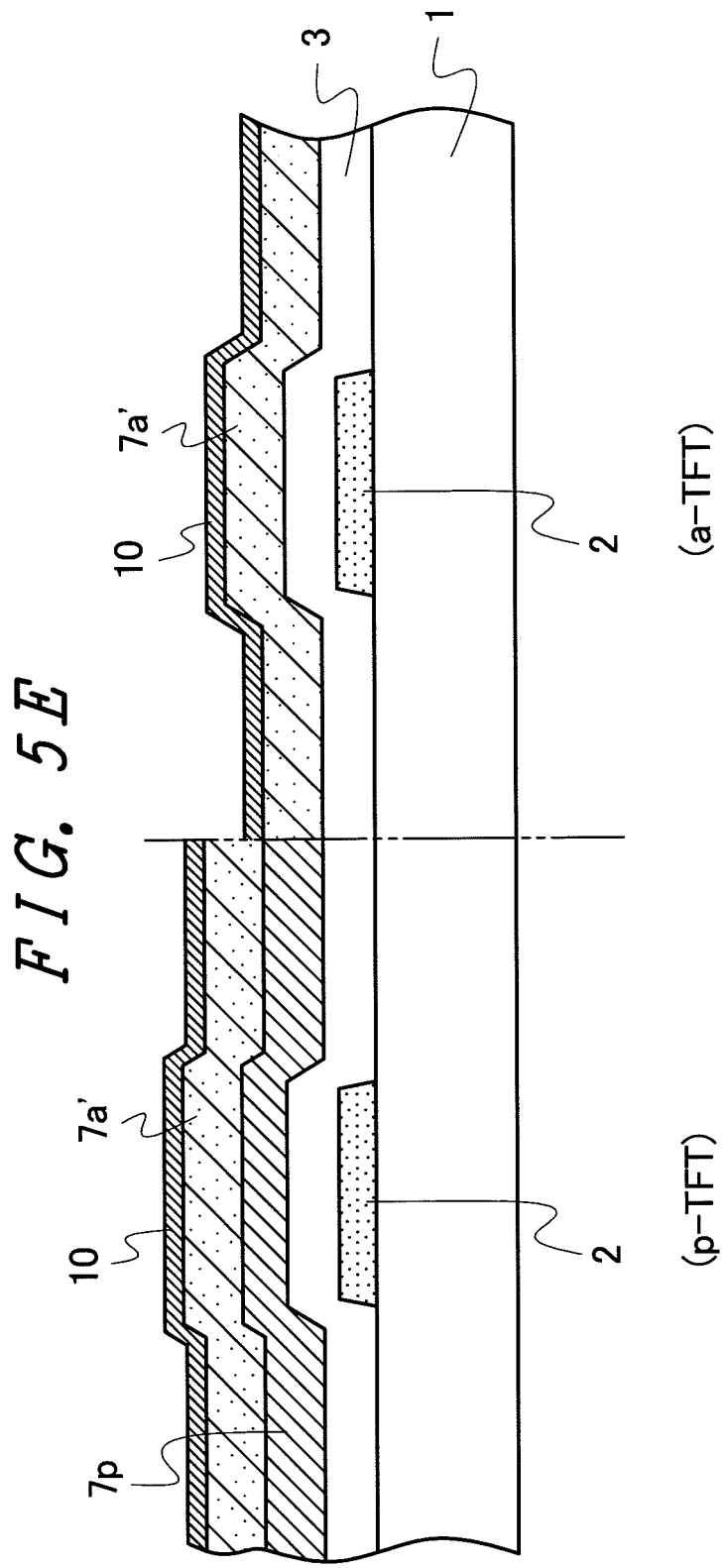

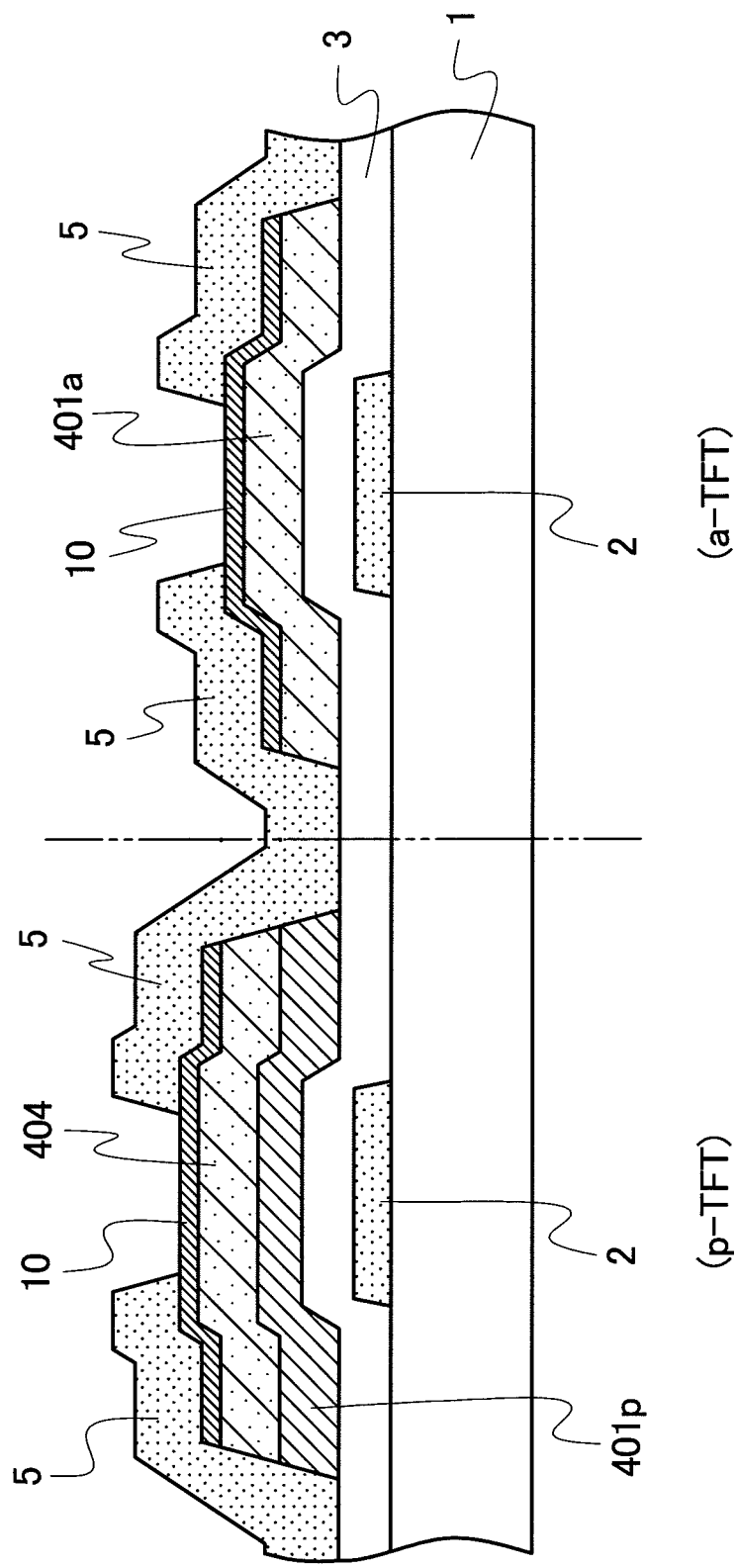

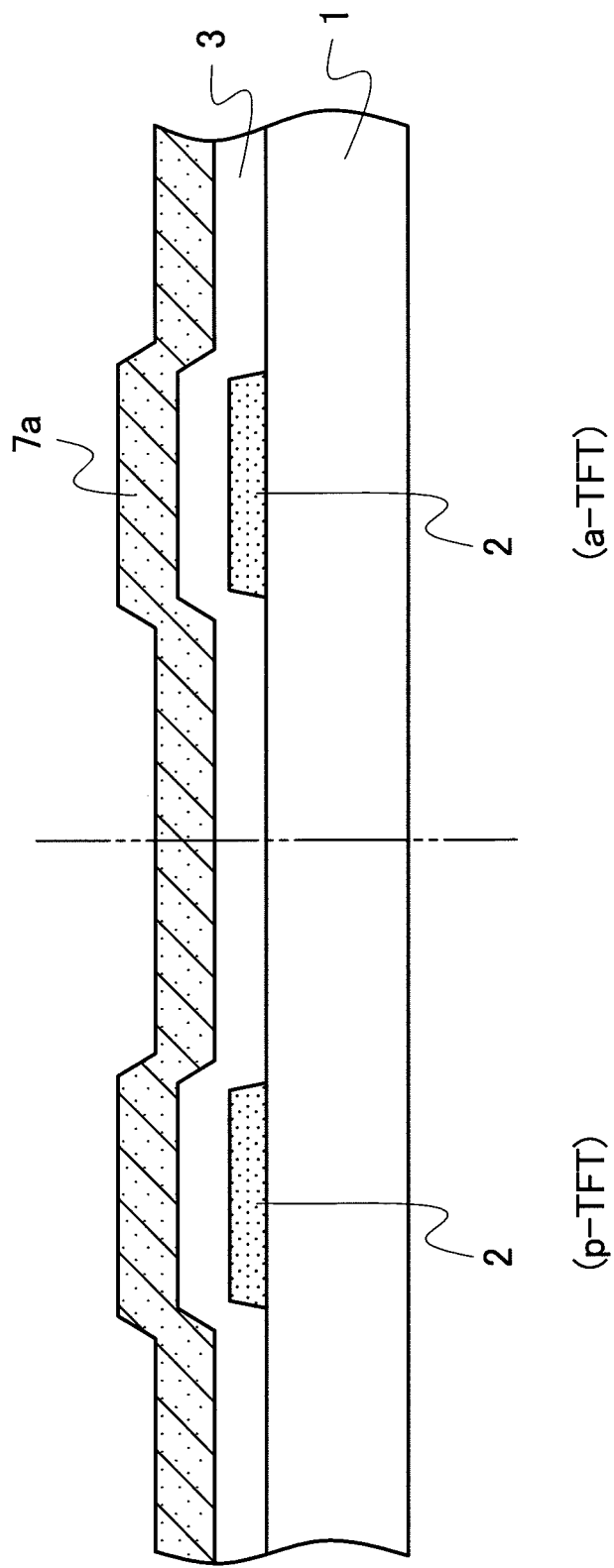

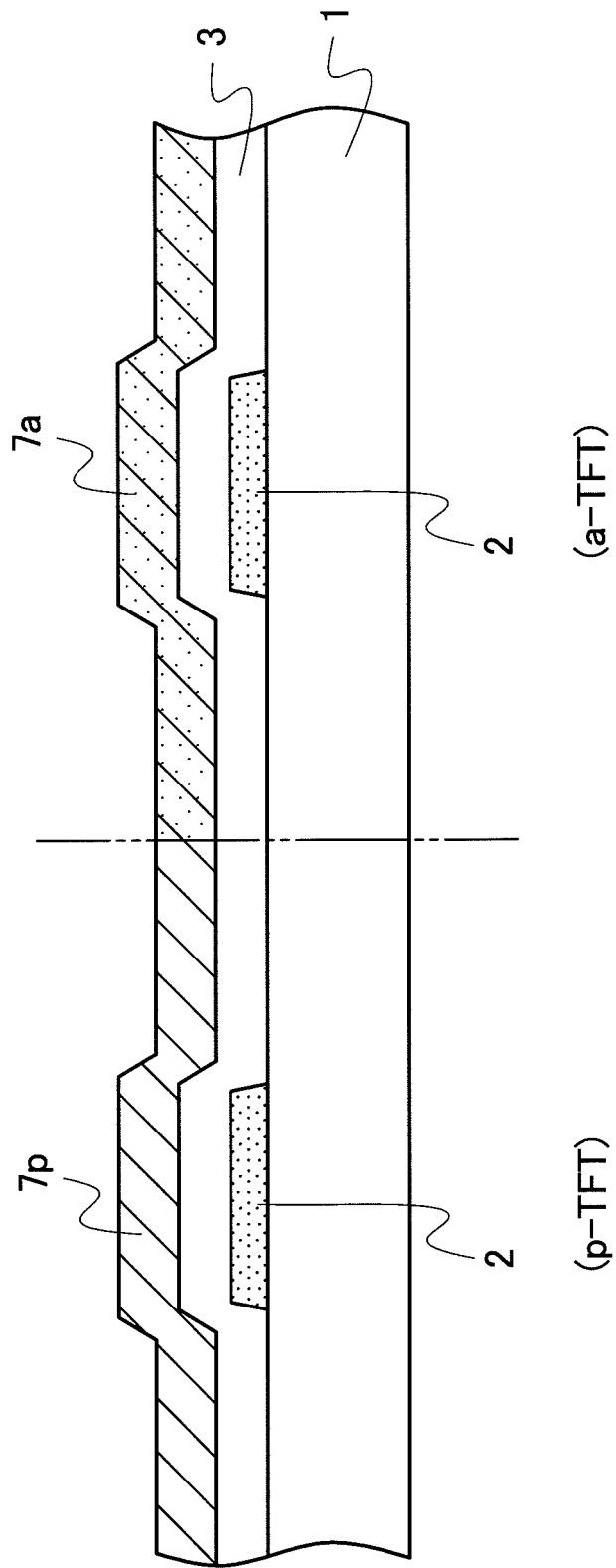

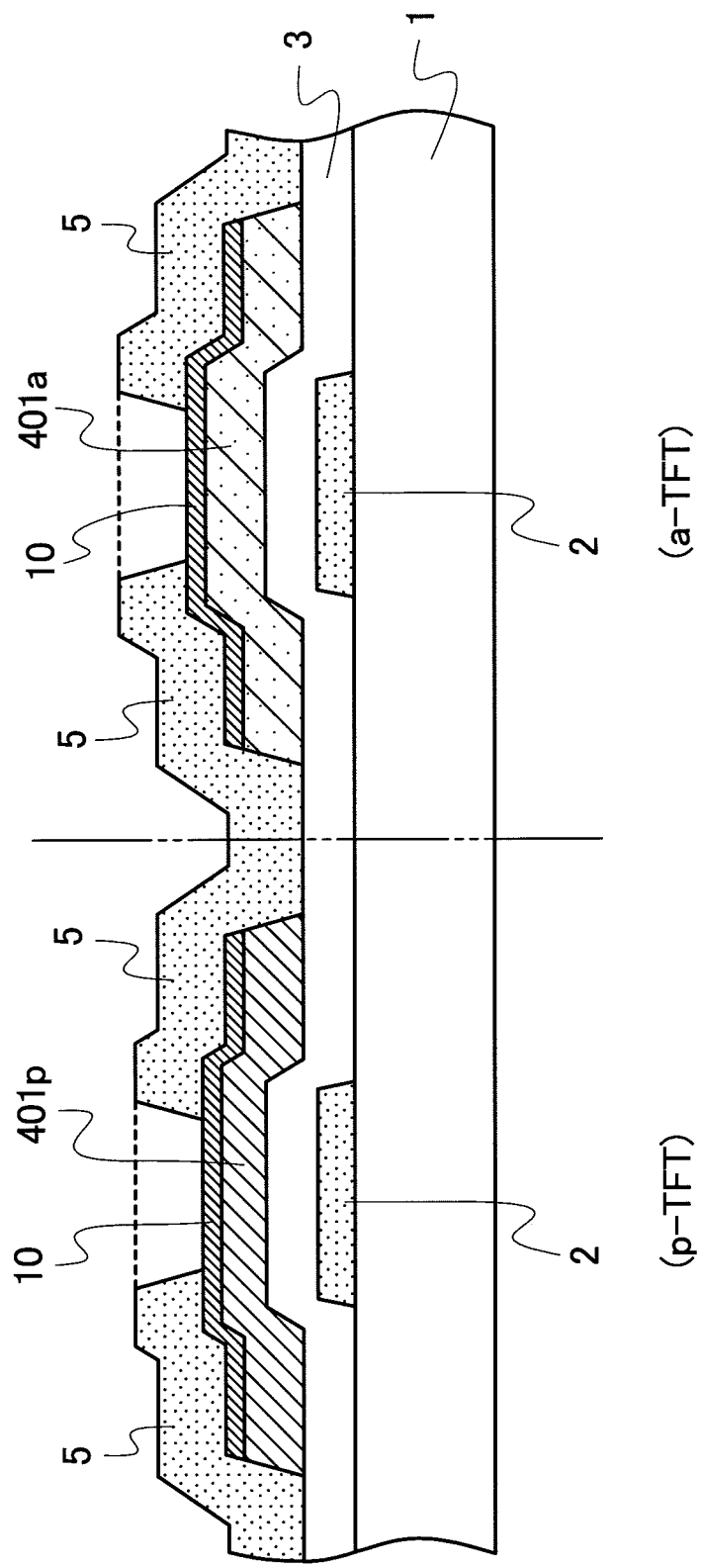

DISPLAY DEVICE AND MANUFACTURING METHOD THEREOF

The present application claims priority from Japanese applications JP2008-067974 filed on Mar. 17, 2008, the content of which is hereby incorporated by reference into this application.

BACKGROUND OF THE INVENTION

1. Field of the Invention

The present invention relates to a display device and more particularly to a technology effectively applicable to a display device with a TFT element having an amorphous semiconductor and a TFT element having a polycrystalline semiconductor both formed on the same substrate.

2. Description of the Related Art

Conventionally, display devices include a liquid crystal display device having a liquid crystal display panel with a liquid crystal material encapsulated between a pair of substrates. A liquid crystal display device is used for a monitor (display) of a TV or PC, for example. For the liquid crystal display device of a TV or the like, an active matrix type liquid crystal display panel (hereinafter simply referred to as "liquid crystal display panel") is used.

In the liquid crystal display panel, a display region is set by an assembly of a plurality of pixels, and each of the pixels has a TFT element functioning as an active element (also referred to as "switching element"), a pixel electrode, and a counter electrode (also referred to as "common electrode").

The TFT elements of the pixels are arranged in a matrix form on one of the pair of substrates (hereinafter referred to as "TFT substrate"). On the TFT substrate, a plurality of scanning signal lines, a plurality of video signal lines, and the pixel electrodes are arranged in addition to the TFT elements.

For an active layer of the TFT element (active element) of the liquid crystal display panel, an amorphous semiconductor such as of amorphous silicon has been conventionally used in many cases. In recent years, however, a polycrystalline semiconductor element such as of polycrystalline silicon has been increasingly used.

In a conventional liquid crystal display device, an IC chip that is manufactured in a separate step from the liquid crystal display panel has been used for a data driver or gate driver for driving the liquid crystal display panel, and is connected to the liquid crystal display panel in an assembly step of the liquid crystal display device in many cases. However, some liquid crystal display devices in recent years use a liquid crystal display panel in which a drive circuit having a function equivalent to that of the IC chip of the data driver or gate driver is formed simultaneously with the TFT elements (active elements), the scanning signal lines, the video signal lines or the like outside the display region of the TFT substrate in a manufacturing step of the TFT substrate, for example.

The drive circuit formed (incorporated) in the TFT substrate is an integrated circuit of a TFT element different from the active element, a capacitor element, a resistance element or the like, and must be operated at a high speed. Therefore, a polycrystalline semiconductor such as of polycrystalline silicon is desirably used for an active layer of a TFT element of the drive circuit.

Here, there are two cases: One is that the TFT element of the drive circuit and the TFT element (active element) of the display region both have an active layer of a polycrystalline semiconductor; and the other is that the TFT element of the drive circuit has an active layer of a polycrystalline semiconductor, and the TFT element of the display region has an active layer of an amorphous semiconductor.

In the case where, among conventional TFT substrates, a TFT substrate in which an active layer of the TFT element of the display region is formed of amorphous silicon is used to form the drive circuit outside the display region of the TFT substrate, the TFT element of the drive circuit has an active layer of a polycrystalline semiconductor, and the TFT element of the display region has an active layer of an amorphous semiconductor in many cases because a conventional manufacturing process of the TFT substrate is utilized.

As described above, when the TFT element having an active layer of a polycrystalline semiconductor (hereinafter referred to as "p-TFT element") and the TFT element having an active layer of an amorphous semiconductor (hereinafter referred to as "a-TFT element") are simultaneously formed on the surface of one insulating substrate, for example, an amorphous semiconductor film is formed on the entire surface of the insulating substrate, the amorphous semiconductor only in the region for forming the drive circuit is melted and crystallized to form a polycrystalline semiconductor, and thereafter the partially polycrystallized amorphous semiconductor film is etched to form active layers of the respective TFT elements. For melting the amorphous semiconductor film, for example, a method referred to as "excimer laser annealing" (ELA) is used (refer to JP-A-5-55570, for example).

SUMMARY OF THE INVENTION

When the a-TFT element is formed in the display region of the conventional TFT substrate, a TFT element of an inverted staggered structure (also referred to as "bottom gate structure") is generally formed in many cases. Therefore, when a TFT substrate having the a-TFT element and the p-TFT element is manufactured by utilizing a manufacturing process of a TFT substrate having the a-TFT element of the inverted staggered structure, it is desirable that the p-TFT element have also the inverted staggered structure.

In this case, the a-TFT element and p-TFT element of the inverted staggered structure are simultaneously formed on an insulating substrate by the procedure as shown in FIGS. 6A to 6E, for example.

FIGS. 6A to 6E are schematic cross sectional views showing one example of a conventional manufacturing method of a TFT substrate having the a-TFT element and p-TFT element of the inverted staggered structure.

FIG. 6A is a schematic cross sectional view after the step of forming a first amorphous silicon film in the conventional manufacturing method. FIG. 6B is a schematic cross sectional view after the step of partially polycrystallizing the first amorphous silicon film in the conventional manufacturing method. FIG. 6C is a schematic cross sectional view after the step of etching the first amorphous silicon film and a second amorphous silicon film in the conventional manufacturing method. FIG. 6D is a schematic cross sectional view after the step of forming a source electrode and a drain electrode in the conventional manufacturing method. FIG. 6E is a schematic cross sectional view after the step of separating the second amorphous silicon film in the conventional manufacturing method.

Each of FIGS. 6A to 6E shows the forming procedure of an a-TFT element on the right side of the two-dot chain line while showing the forming procedure of a p-TFT element on the left side of the two-dot chain line.

When the a-TFT element and p-TFT element of the inverted staggered structure are simultaneously formed on one TFT substrate, first, a gate electrode 2, a first insulating layer 3, and a first amorphous silicon film 7a are formed in this order on the surface of an insulating substrate 1 such as a glass substrate as shown in FIG. 6A. The first insulating layer 3 is an insulating film such as a silicon oxide film or a silicon nitride film, for example, and has a function as a gate insulating film of each of the TFT elements. The first amorphous silicon film 7a is used for an active layer of each of the TFT elements.

Next, for example, the amorphous silicon film 7a in a region for forming the p-TFT element is subjected to an ELA treatment, by which the amorphous silicon film 7a in the region for forming the p-TFT element is converted to polycrystalline silicon 7p as shown in FIG. 6B.

Next, a second amorphous silicon film 10 is formed on the entire surface of the amorphous silicon film 7a in which the region for forming the p-TFT element is converted to the polycrystalline silicon 7p. After an etching resist 11 is formed on the second amorphous silicon film 10 as shown in FIG. 6C, for example, the second amorphous silicon film 10 and the amorphous silicon film 7a in which the region for forming the p-TFT element is converted to the polycrystalline silicon 7p are etched to form an active layer 401a of the a-TFT element and an active layer 401p of the p-TFT element. The second amorphous silicon films 10 left on the active layers 401a and 401p of the respective TFT elements are used as contact layers of the respective TFT elements and each separated into a source contact layer and a drain contact layer in the subsequent step.

Next, the etching resist 11 is removed, and a conductive film covering the active layers 401a and 401p of the respective TFT elements each having the second amorphous silicon film 10 is formed above the first insulating layer 3. Thereafter, the conductive film is etched to form wirings 5 as shown in FIG. 6D, for example. In this case, among the wirings 5, one of two wirings 5 that ride on one active layer 401a serves as the source electrode of the a-TFT element, for example, while the other serves as the drain electrode of the a-TFT element. Similarly, one of two wirings 5 that ride on one active layer 401p serves as the source electrode of the p-TFT element, for example, while the other serves as the drain electrode of the p-TFT element.

Next, for example, the second amorphous silicon films 10 are etched using the wirings 5 as a mask, so that the second amorphous silicon films 10 on the active layers 401a and 401p are each separated into a source contact layer 402 and a drain contact layer 403 as shown in FIG. 6E. Thereafter, a second insulating layer, a pixel electrode or the like is formed although its illustration is omitted.

In the case where the a-TFT element and the p-TFT element are simultaneously formed by the procedure described above, a laser used for the ELA treatment is a pulse oscillation laser such as of ultraviolet light, for example. Therefore, in the case where the first amorphous silicon film 7a is converted to the polycrystalline silicon 7p, when the thickness of the first amorphous silicon film 7a is greater than 75 nm, for example, it is difficult to melt the first amorphous silicon film 7a to the rear side thereof, that is, the interface side between the first amorphous silicon film 7a and the first insulating layer 3. As a result, for example, there arise problems that the crystal grain of the polycrystalline silicon 7p is small, and that the crystallinity thereof is degraded, which leads to a problem that the operating characteristics of the p-TFT element are degraded (lowered).

Further, in the case where the a-TFT element and the p-TFT element are simultaneously formed by the procedure described above, when the second amorphous silicon film 10 is separated into the source contact layer 402 and the drain contact layer 403, the channel regions (regions above the gate electrode 2) of the active layers 401a and 401p are also etched as shown in FIG. 6E. Therefore, it is necessary for the active layers 401a and 401p to have a certain level of thickness in the region above the gate electrode 2 after forming the active layers 401a and 401p of the respective TFT elements.

However, in the case where the first amorphous silicon film 7a is converted to the polycrystalline silicon 7p by the conventional ELA treatment, it is necessary to reduce the thickness of the first amorphous silicon film 7a to from 50 nm to about 60 nm, for example, in order to enhance the crystallinity of the polycrystalline silicon 7p.

When the first amorphous silicon film 7a is converted to the polycrystalline silicon 7p by the conventional ELA treatment, the thickness of the active layer 401p of the p-TFT element above the gate electrode 2 is smaller than that of the first amorphous silicon film 7a. As a result, for example, when the second amorphous silicon film 10 is separated into the source contact layer 402 and the drain contact layer 403, the active layer 401p of the p-TFT element positioned below a portion to be removed in the second amorphous silicon film 10 is thin, which leads to a problem that the operating characteristics of the p-TFT element is degraded (lowered).

It is an object of the invention to provide, for example, in a liquid crystal display device with a TFT element having an active layer of an amorphous semiconductor and a TFT element having an active layer of a polycrystalline semiconductor formed in one TFT substrate, a technology that can easily prevent the operating characteristics of the TFT element having an active layer of a polycrystalline semiconductor from lowering.

It is another object of the invention to provide, when a TFT element having an active layer of an amorphous semiconductor and a TFT element having an active layer of a polycrystalline semiconductor are simultaneously formed in one TFT substrate, a technology that can easily enhance the crystallinity of the active layer of a polycrystalline semiconductor.

The above and other objects and novel features of the invention will become apparent from the description provided in this specification and the accompanying drawings.

Typical outlines of the invention disclosed in the specification will be described below.

(1) A display device includes a TFT substrate in which a plurality of first TFT elements each having an active layer of an amorphous semiconductor and a plurality of second TFT elements each having an active layer of a polycrystalline semiconductor are disposed on a surface of an insulating substrate, wherein the first TFT element and the second TFT element each have an inverted staggered structure with a gate electrode, a gate insulating film, and the active layer stacked in this order on the surface of the insulating substrate and a source electrode and a drain electrode both connected to the active layer via a contact layer above the active layer as viewed from the insulating substrate, and the active layer of the second TFT element has a thickness of more than 60 nm in a position where the contact layer is stacked.

(2) In the display device of (1), the active layer of the second TFT element is a polycrystalline semiconductor mainly including a band-shaped crystal that extends long in a channel length direction of the second TFT element.

(3) A display device includes a TFT substrate in which a plurality of first TFT elements each having an active layer of an amorphous semiconductor and a plurality of second TFT elements each having an active layer of a polycrystalline semiconductor are disposed on a surface of an insulating substrate, wherein the first TFT element and the second TFT element each have an inverted staggered structure with a gate electrode, a gate insulating film, and the active layer stacked in this order on the surface of the insulating substrate and a source electrode and a drain electrode both connected to the active layer via a contact layer above the active layer as viewed from the insulating substrate, the active layer of the second TFT element has a first active layer formed of a polycrystalline semiconductor and a second active layer formed of an amorphous semiconductor stacked in this order on the gate insulating film as viewed from the insulating substrate, and the first active layer has a thickness of more than 60 nm in a portion positioned above the gate electrode as viewed from the insulating substrate.

(4) In the display device of (3), the first active layer of the second TFT element is a polycrystalline semiconductor mainly including a band-shaped crystal that extends long in a channel length direction of the second TFT element.

(5) In the display device of (3) or (4), the active layer of the first TFT element is formed of only an amorphous semiconductor, and the active layer of the first TFT element has substantially the same thickness as the second active layer of the second TFT element.

(6) In any of the display devices of (1) to (5), the plurality of first TFT elements are disposed in a matrix form in a display region on the surface of the insulating substrate, and the plurality of second TFT elements are disposed outside the display region on the surface of the insulating substrate.

(7) A method for manufacturing a display device in which a plurality of first TFT elements each having an active layer of an amorphous semiconductor and a plurality of second TFT elements each having an active layer of a polycrystalline semiconductor are formed on a surface of an insulating substrate, the method including: a first step of forming a gate electrode of each of the TFT elements, an insulating layer having a function as a gate insulating film of each of the TFT elements, and a first amorphous semiconductor film in this order on the surface of the insulating substrate; a second step of, after the first step, converting a portion of the first amorphous semiconductor film in a region for forming the second TFT element to a polycrystalline semiconductor; a third step of, after the second step, forming a second amorphous semiconductor film on the first amorphous semiconductor film that is partially converted to a polycrystalline semiconductor, and etching the second amorphous semiconductor film and the first amorphous semiconductor film to form an active layer of the first TFT element formed of the first amorphous semiconductor film and an active layer of the second TFT element formed of the polycrystalline semiconductor; a fourth step of, after the third step, forming a source electrode and a drain electrode of each of the TFT elements, the source electrode and the drain electrode riding on each of the active layers from the surface of the insulating layer; and a fifth step of, after the fourth step, separating the second amorphous semiconductor film on each of the active layers into a source contact layer and a drain contact layer, wherein in the step of forming the first amorphous semiconductor film in the first step, the first amorphous semiconductor film is formed to a thickness of 75 nm or more, and in the second step, the first amorphous semiconductor film is melted and crystallized while moving a continuous-wave laser in a predetermined direction to form a polycrystalline semiconductor mainly including a band-shaped crystal that extends long in the predetermined direction.

(8) A method for manufacturing a display device in which a plurality of first TFT elements each having an active layer of an amorphous semiconductor and a plurality of second TFT elements each having an active layer of a polycrystalline semiconductor are formed on a surface of an insulating substrate, the method including: a first step of forming a gate electrode of each of the TFT elements, an insulating layer having a function as a gate insulating film of each of the TFT elements, and a first amorphous semiconductor film in this order on the surface of the insulating substrate; a second step of, after the first step, converting a portion of the first amorphous semiconductor film in a region for forming the second TFT element to a polycrystalline semiconductor; a third step of, after the second step, etching the first amorphous semiconductor film that is partially converted to a polycrystalline semiconductor to form an active layer of the first TFT element formed of the first amorphous semiconductor film and an active layer of the second TFT element formed of the polycrystalline semiconductor; a fourth step of, after the third step, forming a second amorphous semiconductor film on the active layer of each of the TFT elements; a fifth step of, after the fourth step, forming a source electrode and a drain electrode of each of the TFT elements, the source electrode and the drain electrode riding on each of the active layers from the surface of the insulating layer; and a sixth step of, after the fifth step, separating the second amorphous semiconductor film on each of the active layers into a source contact layer and a drain contact layer, wherein in the step of forming the first amorphous semiconductor film in the first step, the first amorphous semiconductor film is formed to a thickness of 75 nm or more, and in the second step, the first amorphous semiconductor film is melted and crystallized while moving a continuous-wave laser in a predetermined direction to form a polycrystalline semiconductor mainly including a band-shaped crystal that extends long in the predetermined direction.

(9) A method for manufacturing a display device in which a plurality of first TFT elements each having an active layer of an amorphous semiconductor and a plurality of second TFT elements each having an active layer of a polycrystalline semiconductor are formed on a surface of an insulating substrate, the method including: a first step of forming a gate electrode of each of the TFT elements, an insulating layer having a function as a gate insulating film of each of the TFT elements, and a first amorphous semiconductor film in this order on the surface of the insulating substrate; a second step of, after the first step, converting a portion of the first amorphous semiconductor film in a region for forming the second TFT element to a polycrystalline semiconductor; a third step of, after the second step, removing an amorphous semiconductor portion of the first amorphous semiconductor film while leaving the portion that is converted to the polycrystalline semiconductor; a fourth step of, after the third step, forming a third amorphous semiconductor film and the second amorphous semiconductor film in this order on the entire surface of the insulating layer; a fifth step of, after the fourth step, etching the second amorphous semiconductor film, the third amorphous semiconductor film, and the polycrystalline semiconductor to form an active layer of the first TFT element formed of the third amorphous semiconductor film and an active layer of the second TFT element formed of the polycrystalline semiconductor and the third amorphous semiconductor film; a sixth step of, after the fifth step, forming a source electrode and a drain electrode of each of the TFT elements, the source electrode and the drain electrode riding on each of the active layers from the surface of the insulating layer; and a seventh step of, after the sixth step, separating the second amorphous semiconductor film on each of the active layers into a source contact layer and a drain contact layer, wherein in the step of forming the first amorphous semiconductor film in the first step, the first amorphous semiconductor film is formed to a thickness of 75 nm or more, and in the second step, the first amorphous semiconductor film is melted and crystallized while moving a continuous-wave laser in a predetermined direction to form a polycrystalline semiconductor mainly including a band-shaped crystal that extends long in the predetermined direction.

(10) In any of the methods for manufacturing the display device of (7) to (9), the predetermined direction coincides with a channel length direction of the second TFT element.

(11) In any of the methods for manufacturing the display device of (7) to (10), the continuous-wave laser has a wavelength of more than 400 nm.

(12) In any of the methods for manufacturing the display device of (7) to (11), the continuous-wave laser has a wavelength of 532 nm.

According to the invention, for example, in a liquid crystal display device having a TFT element having an active layer of an amorphous semiconductor and a TFT element having an active layer of a polycrystalline semiconductor formed in one TFT substrate, the operating characteristics of the TFT element having an active layer of a polycrystalline semiconductor can be prevented from lowering.

Further, according to invention, for example, when a TFT element having an active layer of an amorphous semiconductor and a TFT element having an active layer of a polycrystalline semiconductor are simultaneously formed in one TFT substrate, the crystallinity of the active layer of a polycrystalline semiconductor can be easily enhanced.

BRIEF DESCRIPTION OF THE DRAWINGS

FIG. 2A is a schematic cross sectional view after the step of forming a first amorphous silicon film in a manufacturing method of a TFT element of Example 1;

FIG. 2C is a schematic cross sectional view of the step of partially polycrystallizing the first amorphous silicon film in the manufacturing method of the TFT element of Example 1;

FIG. 2D is a schematic cross sectional view after the step of partially polycrystallizing the first amorphous silicon film in the manufacturing method of the TFT element of Example 1;

FIG. 2E is a schematic cross sectional view after the step of forming a second amorphous silicon film in the manufacturing method of the TFT element of Example 1;

FIG. 2F is a schematic cross sectional view after the step of etching the first amorphous silicon film and the second amorphous silicon film in the manufacturing method of the TFT element of Example 1;

FIG. 2G is a schematic cross sectional view after the step of forming a source electrode and a drain electrode in the manufacturing method of the TFT element of Example 1;

FIG. 2H is a schematic cross sectional view after the step of separating the second amorphous silicon film in the manufacturing method of the TFT element of Example 1;

FIG. 2I is a schematic cross sectional view after the step of forming a second insulating layer in the manufacturing method of the TFT element of Example 1;

FIG. 5A is a schematic cross sectional view after the step of dehydrogenating the first amorphous silicon film in a manufacturing method of a TFT element of Example 2;

FIG. 5C is a schematic cross sectional view after the step of partially polycrystallizing the first amorphous silicon film in the manufacturing method of the TFT element of Example 2;

FIG. 5D is a schematic cross sectional view after the step of removing an amorphous portion of the first amorphous silicon film in the manufacturing method of the TFT element of Example 2;

FIG. 5E is a schematic cross sectional view after the step of forming a third amorphous silicon film and the second amorphous silicon film in the manufacturing method of the TFT element of Example 2;

FIG. 5G is a schematic cross sectional view after the step of forming a source electrode and a drain electrode in the manufacturing method of the TFT element of Example 2;

FIG. 6A is a schematic cross sectional view after the step of forming the first amorphous silicon film in a conventional manufacturing method;

FIG. 6B is a schematic cross sectional view after the step of partially polycrystallizing the first amorphous silicon film in the conventional manufacturing method;

FIG. 6D is a schematic cross sectional view after the step of forming a source electrode and a drain electrode in the conventional manufacturing method.

DESCRIPTION OF THE PREFERRED EMBODIMENTS

Figure 1A:
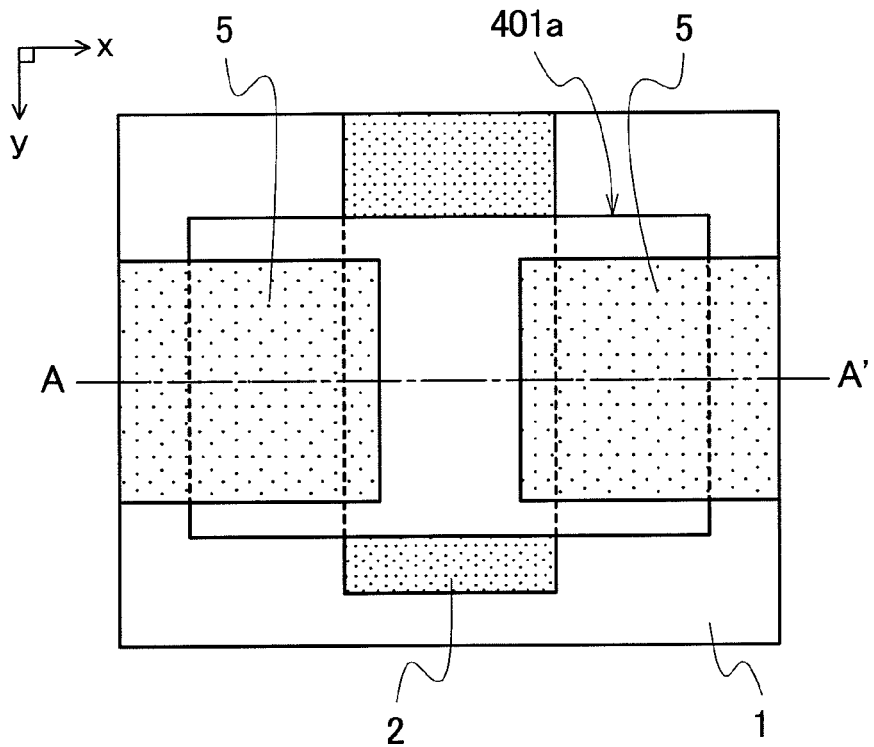
FIG. 1A is a schematic plan view showing one configuration example of a TFT element of an inverted staggered structure having an active layer formed of an amorphous semiconductor.

Hereinafter, the invention will be described in detail along with embodiments (examples) referring to the drawings.

Throughout the drawings for explaining examples, components having the same functions have the same reference numerals, and the repetitive description thereof is omitted.

FIGS. 1A to 1D are schematic views for explaining a schematic configuration of a TFT element included in a display device related to the invention.

Figure 1B:
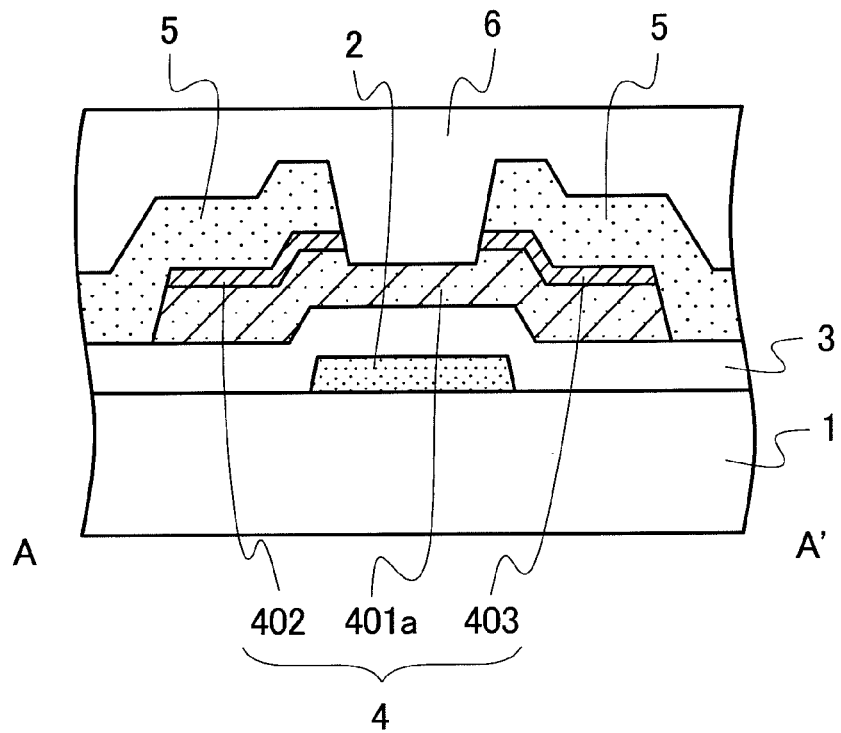
FIG. 1B is a schematic cross sectional view of the TFT element taken along line A-A' in FIG. 1A.
Figure 1C:
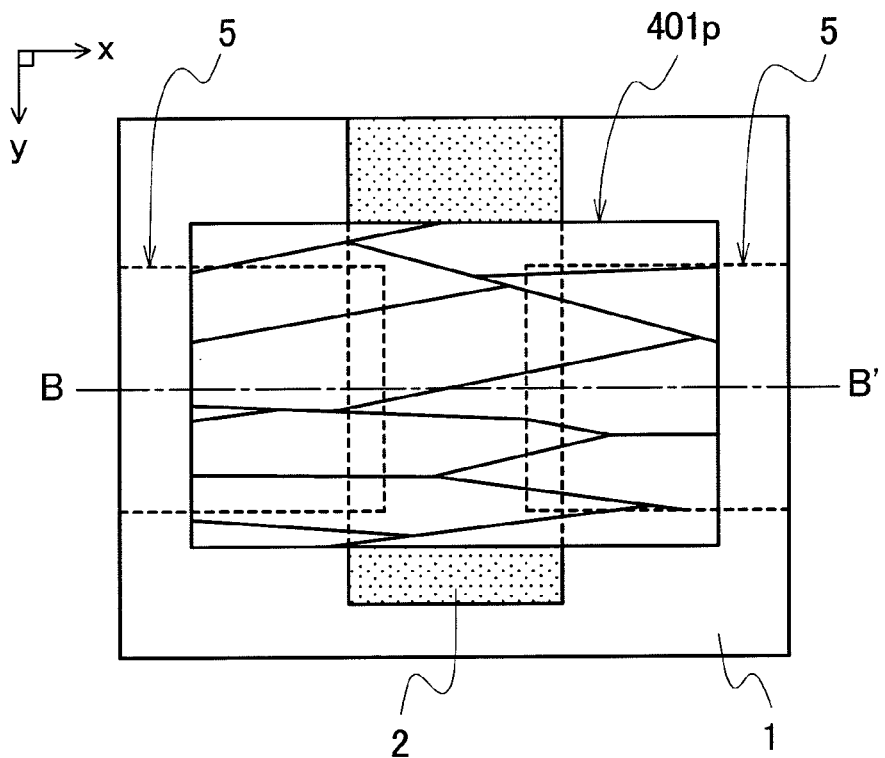
FIG. 1C is a schematic plan view showing one configuration example of a TFT element of an inverted staggered structure having an active layer formed of a polycrystalline semiconductor.
Figure 1D:
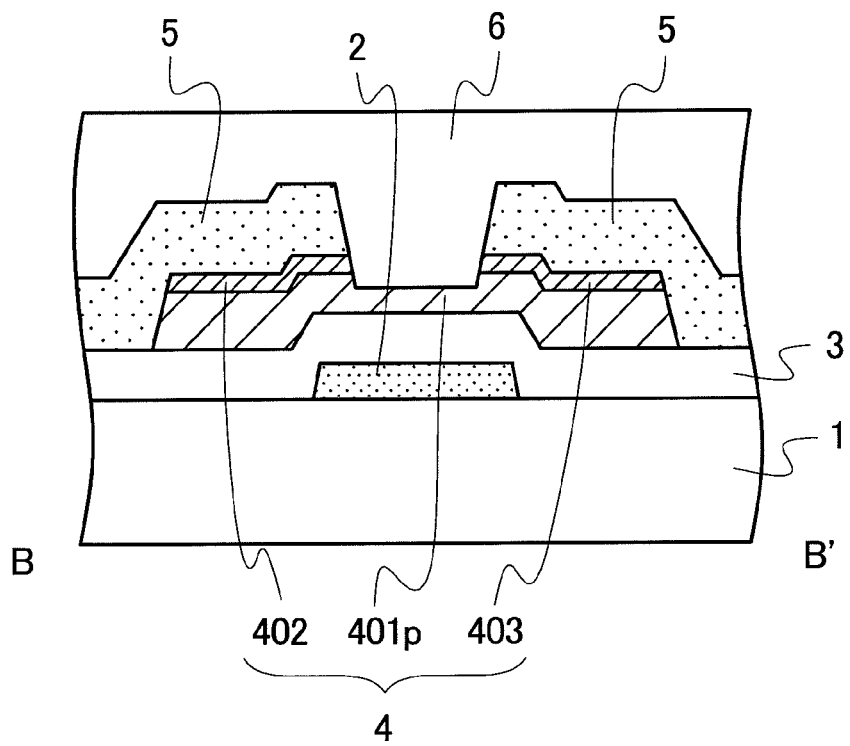
FIG. 1D is a schematic cross sectional view of the TFT element taken along line B-B' in FIG. 1C.

FIG. 1A is a schematic plan view showing one configuration example of a TFT element of an inverted staggered structure having an active layer formed of an amorphous semiconductor. FIG. 1B is a schematic cross sectional view of the TFT element taken along line A-A' in FIG. 1A. FIG. 1C is a schematic plan view showing one configuration example of a TFT element of the inverted staggered structure having an active layer formed of a polycrystalline semiconductor. FIG. 1D is a schematic cross sectional view of the TFT element taken along line B-B' in FIG. 1C.

The invention is applied to an active matrix type TFT liquid crystal display device, for example, in which first TFT elements (hereinafter referred to as "a-TFT elements") each having an active layer formed of an amorphous semiconductor are arranged in a matrix form in a display region of a TFT substrate, and second TFT elements (hereinafter referred to as "p-TFT elements") each having an active layer formed of a polycrystalline semiconductor are formed outside the display region. In this case, for example, the p-TFT element is used for the formation of an integrated circuit functioning as a data driver or gate driver and formed on an insulating substrate such as a glass substrate similarly to the a-TFT element.

The a-TFT element in a TFT substrate of a liquid crystal display device generally has the inverted staggered structure (also referred to as "bottom gate structure"), and the basic structure thereof is as shown in FIGS. 1A and 1B, for example.

That is, a gate electrode 2, a first insulating layer 3 having a function as a gate insulating film, and a semiconductor layer 4 are stacked in this order on the surface of an insulating substrate 1. Further, wirings 5 are also formed above the first insulating layer 3, and one portion (end) of the wiring 5 rides on the semiconductor layer 4. In this case, two wirings 5 that are electrically independent of one another ride on one semiconductor layer 4. When one of the wirings 5 functions as a source electrode, the other wiring 5 functions as a drain.

The semiconductor layer 4 of the a-TFT element includes an active layer 401a formed of a first amorphous semiconductor, a source contact layer 402 lying between the active layer 401a and one of the wirings 5 (source electrode), and a drain contact layer 403 lying between the active layer 401a and the other wiring 5 (drain electrode). In this case, the source contact layer 402 and the drain contact layer 403 are each formed of a second amorphous semiconductor different from the first amorphous semiconductor in the kind or concentration of an impurity.

A second insulating layer 6 intended to protect the a-TFT element is formed on the a-TFT element.

In the case where a p-TFT element of the same inverted staggered structure as the a-TFT element is formed on the surface of the insulating substrate 1, the structure of the p-TFT element is as shown in FIGS. 1C and 1D.

That is, the gate electrode 2, the first insulating layer 3 having a function as a gate insulating film, and the semiconductor layer 4 are stacked in this order on the surface of the insulating substrate 1. Further, the wirings 5 are also formed above the first insulating layer 3, and one portion (end) of the wiring 5 rides on the semiconductor layer 4. In this case, two wirings 5 that are electrically independent of one another ride on one semiconductor layer 4. When one of the wirings 5 functions as a source electrode, the other wiring 5 functions as a drain.

The semiconductor layer 4 of the p-TFT element includes an active layer 401p formed of a polycrystalline semiconductor, the source contact layer 402 lying between the active layer 401p and one of the wirings 5 (source electrode), and the drain contact layer 403 lying between the active layer 401p and the other wiring 5 (drain electrode). In this case, the source contact layer 402 and drain contact layer 403 of the p-TFT element are each formed of the same second amorphous semiconductor as the source contact layer 402 and drain contact layer 403 of the a-TFT element, for example.

Further, in the p-TFT element related to the invention, the active layer 401p is formed of a polycrystalline semiconductor mainly including a band-shaped crystal that extends long in a channel length direction of the p-TFT element. In FIG. 1C, the thin solid lines shown inside the rectangular active layer 401p show crystal grain boundaries, and the region surrounded by the crystal grain boundaries is in a single crystal state. In the p-TFT element having the active layer 401p described above, carriers move smoothly in the active layer 401p, whereby the p-TFT element can be operated at a high speed.

The second insulating layer 6 intended to protect the p-TFT element is formed on the p-TFT element.

The invention intends to easily reduce variation in operating characteristics in the plurality of p-TFT elements when the plurality of a-TFT elements and plurality of p-TFT elements of the inverted staggered structure are simultaneously formed on the surface of one insulating substrate 1.

EXAMPLE 1

FIGS. 2A to 2I are schematic views for explaining a manufacturing method of a TFT element of Example 1 according to the invention.

Figure 2B:
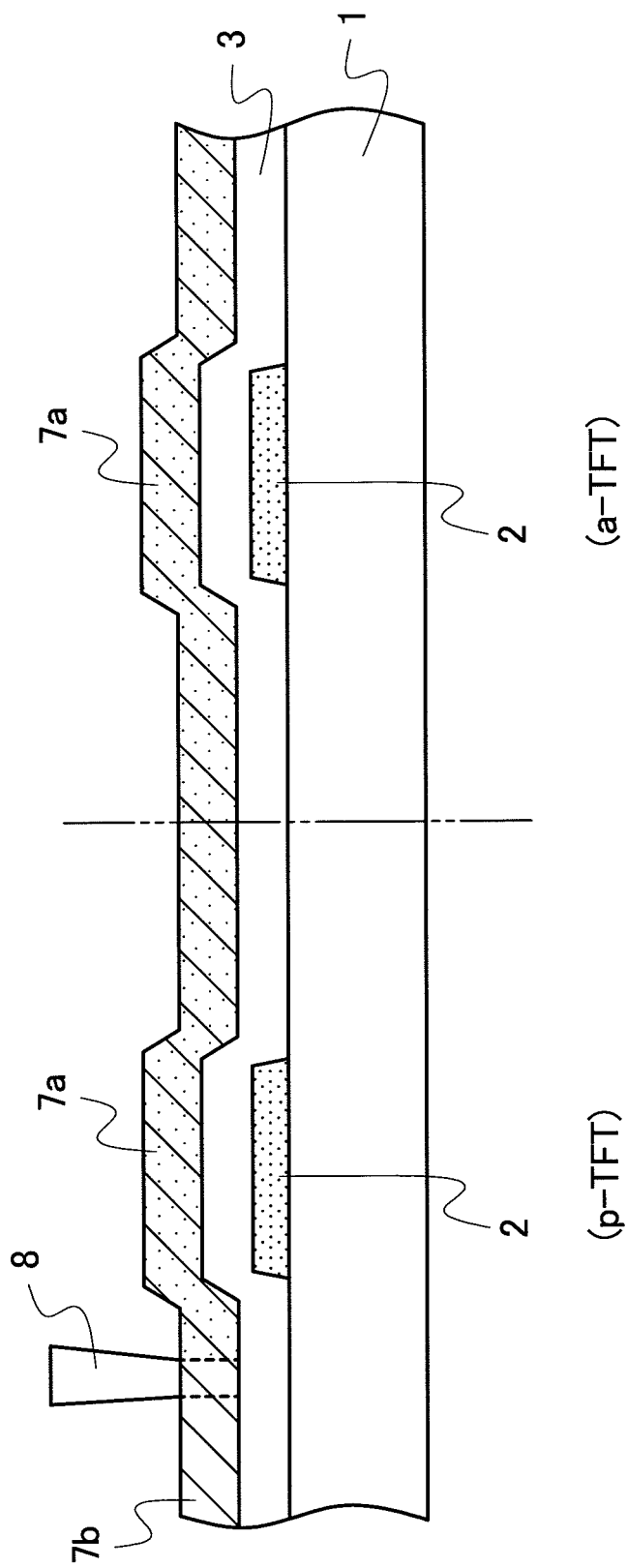
FIG. 2B is a schematic cross sectional view of the step of partially dehydrogenating the first amorphous silicon film in the manufacturing method of the TFT element of Example 1.
Figure 21:
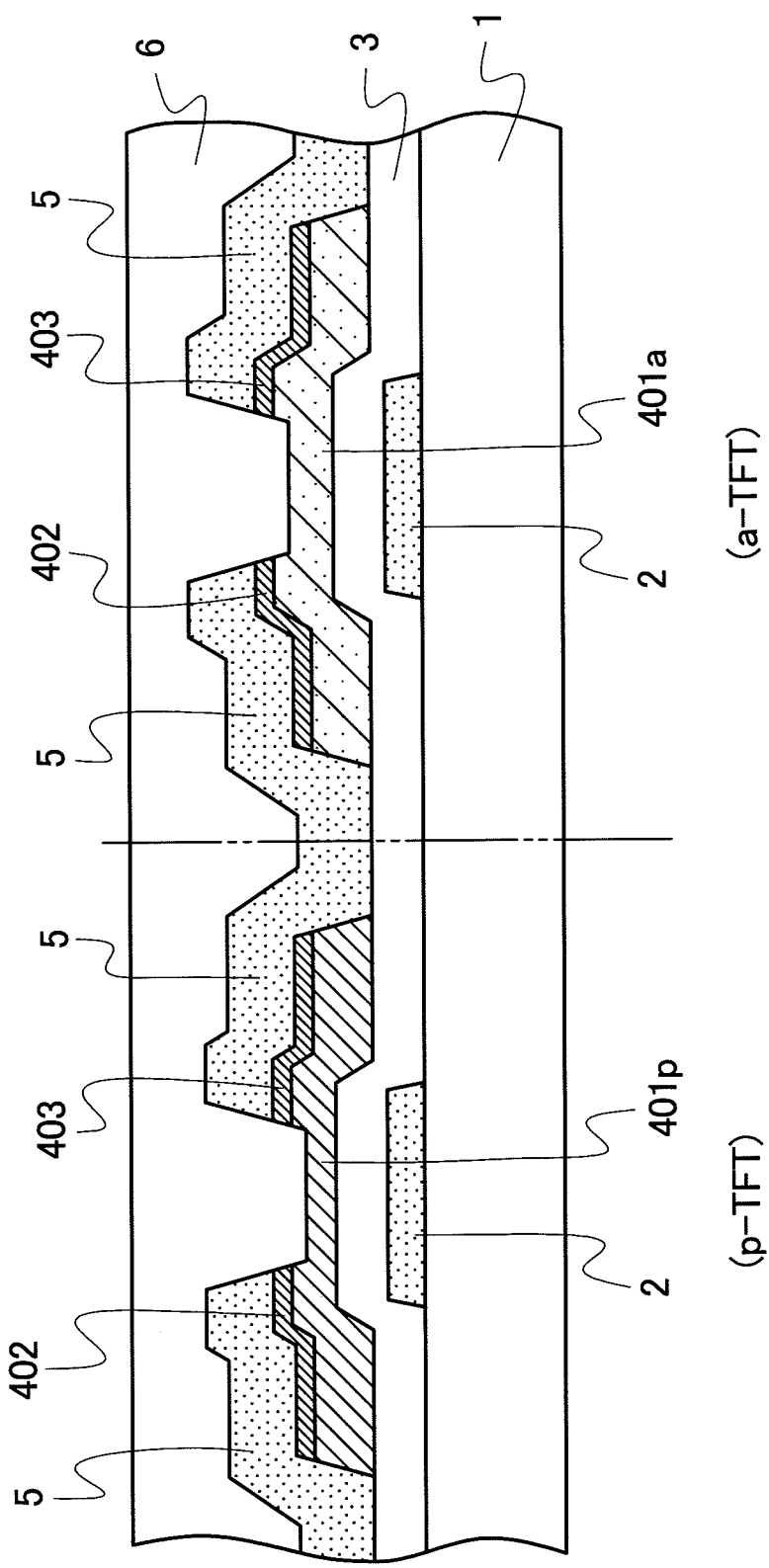

FIG. 2A is a schematic cross sectional view after the step of forming a first amorphous silicon film in the manufacturing method of the TFT element of Example 1. FIG. 2B is a schematic cross sectional view of the step of partially dehydrogenating the first amorphous silicon film in the manufacturing method of the TFT element of Example 1. FIG. 2C is a schematic cross sectional view of the step of partially polycrystallizing the first amorphous silicon film in the manufacturing method of the TFT element of Example 1. FIG. 2D is a schematic cross sectional view after the step of partially polycrystallizing the first amorphous silicon film in the manufacturing method of the TFT element of Example 1. FIG. 2E is a schematic cross sectional view after the step of forming a second amorphous silicon film in the manufacturing method of the TFT element of Example 1. FIG. 2F is a schematic cross sectional view after the step of etching the first amorphous silicon film and the second amorphous silicon film in the manufacturing method of the TFT element of Example 1. FIG. 2G is a schematic cross sectional view after the step of forming a source electrode and a drain electrode in the manufacturing method of the TFT element of Example 1. FIG. 2H is a schematic cross sectional view after the step of separating the second amorphous silicon film in the manufacturing method of the TFT element of Example 1. FIG. 2I is a schematic cross sectional view after the step of forming a second insulating layer in the manufacturing method of the TFT element of Example 1.

Each of FIGS. 2A to 2I shows the forming procedure of an a-TFT element having the cross sectional configuration of FIG. 1B on the right side of the two-dot chain line while showing the forming procedure of a p-TFT element having the cross sectional configuration of FIG. 1D on the left side of the two-dot chain line.

The manufacturing method of the TFT element of Example 1 is a manufacturing method of simultaneously forming the a-TFT element and p-TFT element of the inverted staggered structure on one insulating substrate 1. First, as shown in FIG. 2A, the gate electrode 2, the first insulating layer 3, and a first amorphous silicon film 7a are formed in this order on the surface of the insulating substrate 1 such as a glass substrate.

For example, the gate electrode 2 is formed of a high-melting conductor material such as molybdenum-tungsten (MoW). The reason why the gate electrode 2 is formed of a high-melting conductor material is to prevent the deformation of the gate electrode 2 when the region for forming the p-TFT element is irradiated with a continuous-wave laser in the subsequent step, for example. Therefore, the gate electrode 2 in the region for forming the a-TFT element may be formed of a conductor material having a high electric conductivity, such as aluminum, for example. The first insulating layer 3 is formed by depositing an insulating film such as a silicon oxide film or a silicon nitride film, for example.

The first amorphous silicon film 7a is used for an active layer of each of the TFT elements and formed by depositing the film to a thickness of 75 nm or more in Example 1, for example.

Further, the first amorphous silicon film 7a is etched as it is to be used as the active layer 401a of the a-TFT element and contains a large amount of hydrogen therein. Therefore, as shown in FIG. 2B, for example, next, the first amorphous silicon film 7a only in the region for forming the p-TFT element is irradiated with a laser 8 so as to be heated, thereby being converted to a dehydrogenated amorphous silicon film 7b. The laser 8 irradiated at this time is irradiated at such a wavelength and intensity (energy) that the first amorphous silicon film 7a does not melt because the laser 8 is irradiated for dehydrogenating the first amorphous silicon film 7a.

Next, as shown in FIG. 2C, for example, the dehydrogenated amorphous silicon film 7b in the region for forming the p-TFT element is irradiated with a laser 9, thereby being converted to polycrystalline silicon 7p. The laser 9 irradiated at this time is a continuous-wave laser at a wavelength of 532 nm, for example. Silicon 7m that is melted by the irradiation of the laser 9 is crystallized into the polycrystalline silicon 7p. Also in this case, for example, the laser 9 is irradiated while moving (scanning) in the channel length direction of the p-TFT element at a predetermined speed, so that polycrystalline silicon mainly includes a band-shaped crystal that extends long in one direction (channel length direction) as shown in FIG. 1C, for example.

In the case where the silicon 7m that is melted by the irradiation of the continuous-wave laser 9 is crystallized into the polycrystalline silicon 7p as described above, the thickness of the polycrystalline silicon 7p above the gate electrode 2 of the p-TFT element is smaller than that of the first amorphous silicon film 7a above the gate electrode 2 of the a-TFT element as shown in FIG. 2D, for example. In the case of the manufacturing method of Example 1, however, the thickness of the polycrystalline silicon 7p above the gate electrode 2 of the p-TFT element can be made 60 nm or more (about 70 nm, for example) because the thickness of the first amorphous silicon film 7a that is formed (deposited) first is 75 nm or more.

Further, when the first amorphous silicon film 7a is converted to the polycrystalline silicon 7p, the wavelength is made longer than that of a laser used in a conventional ELA treatment, and the continuous-wave laser is used, so that the first amorphous silicon film 7a can be melted to the rear side thereof (interface side between the first amorphous silicon film 7a and the first insulating layer 3) even when the thickness of the first amorphous silicon film 7a is 75 nm or more. Therefore, it is possible to reduce unevenness of the thickness of the polycrystalline silicon 7p above the gate electrode 2 of the p-TFT element as well as to reduce variation in crystallinity.

After the first amorphous silicon film 7a in the region for forming the p-TFT element is converted to the polycrystalline silicon 7p, a second amorphous silicon film 10 is formed on the entire surface of the first amorphous silicon film 7a that is partially converted to polycrystalline silicon as shown in FIG. 2E, for example. The second amorphous silicon film 10 is used as the source contact layer 402 and the drain contact layer 403. Therefore, in the case where the a-TFT element and the p-TFT element are n-channel MOS transistors, the second amorphous silicon film 10 is formed by depositing n-type amorphous silicon at a high concentration, for example.

Next, after an etching resist 11 is formed on the second amorphous silicon film 10 as shown in FIG. 2F, for example, the second amorphous silicon film 10 and the first amorphous silicon film 7a in which the region for forming the p-TFT element is converted to the polycrystalline silicon 7p are etched to form the active layer 401a of the a-TFT element and the active layer 401p of the p-TFT element. The second amorphous silicon films 10 left on the active layers 401a and 401p of the respective TFT elements are each separated into the source contact layer 402 and the drain contact layer 403 in the subsequent step.

Next, the etching resist 11 is removed, and a conductive film covering the active layers 401a and 401p of the respective TFT elements each having the second amorphous silicon film 10 is formed above the first insulating layer 3. Thereafter, the conductive film is etched to form the wirings 5 as shown in FIG. 2G, for example. In this case, among the wirings 5, one of two wirings 5 that ride on one active layer 401a serves as the source electrode of the a-TFT element, for example, while the other serves as the drain electrode of the a-TFT element. Similarly, one of two wirings 5 that ride on one active layer 401p serves as the source electrode of the p-TFT element, for example, while the other serves as the drain electrode of the p-TFT element.

Next, for example, the second amorphous silicon films 10 are etched using the wirings 5 as a mask, so that the second amorphous silicon films 10 on the active layers 401a and 401p are each separated into the source contact layer 402 and the drain contact layer 403 as shown in FIG. 2H.

In this case, when a channel protection layer is not present in the second amorphous silicon films 10 at portions to be removed in the step of separating the second amorphous silicon film 10 into the source contact layer 402 and the drain contact layer 403, the channel regions (regions above the gate electrodes 2) of the active layers 401a and 401p are also etched as shown in FIG. 2H. In the manufacturing method of Example 1, however, when the first amorphous silicon film 7a is formed first, for example, the thickness of the first amorphous silicon film 7a is 75 nm or more. Therefore, a thickness of about 70 nm can be ensured for the polycrystalline silicon 7p above the gate electrode 2 of the p-TFT element. Accordingly, a sufficient thickness can be ensured for the channel portion of the active layer 401p of the p-TFT element, whereby the operating characteristics of the p-TFT element can be prevented from lowering.

Thereafter, the second insulating layer 6 protecting the TFT elements is formed as shown in FIG. 2I, for example. The second insulating layer 6 may be a single insulating layer or a stacked layer of two or more kinds of insulating layers.

As described above, according to the manufacturing method of the TFT element of Example 1, when the plurality of a-TFT elements and plurality of p-TFT elements of the inverted staggered structure are formed on the surface of one insulating substrate, they can be effectively formed by utilizing a conventional manufacturing process of the a-TFT element of the inverted staggered structure.

Further, according to the manufacturing method of Example 1, even when the thickness of the first amorphous silicon film 7a used for the formation of the active layer 401a of the a-TFT element and the active layer 401p of the p-TFT element is 75 nm or more, for example, the active layer 401p (polycrystalline silicon) of the p-TFT element has good crystallinity, whereby the operating characteristics of the p-TFT element can be easily prevented from lowering.

Still further, according to the manufacturing method of Example 1, the thickness of the active layer 401a of the a-TFT element can also be made great, whereby the operating characteristics (mobility of carriers, for example) of the a-TFT element can be easily enhanced.

In the manufacturing method of Example 1, after forming (depositing) the second amorphous silicon film 10, etching is performed to form the active layers 401a and 401p as shown in FIGS. 2E and 2F. However, the manufacturing method is not limited thereto. It is apparent that after etching is performed to form the active layers 401a and 401p, the second amorphous silicon film 10 can be formed on the active layers 401a and 401p.

FIGS. 3A to 3D, 4A, and 4B are schematic views showing one configuration example of a liquid crystal display panel to which the manufacturing method of the TFT element of Example 1 can be applied.

Figure 3A:
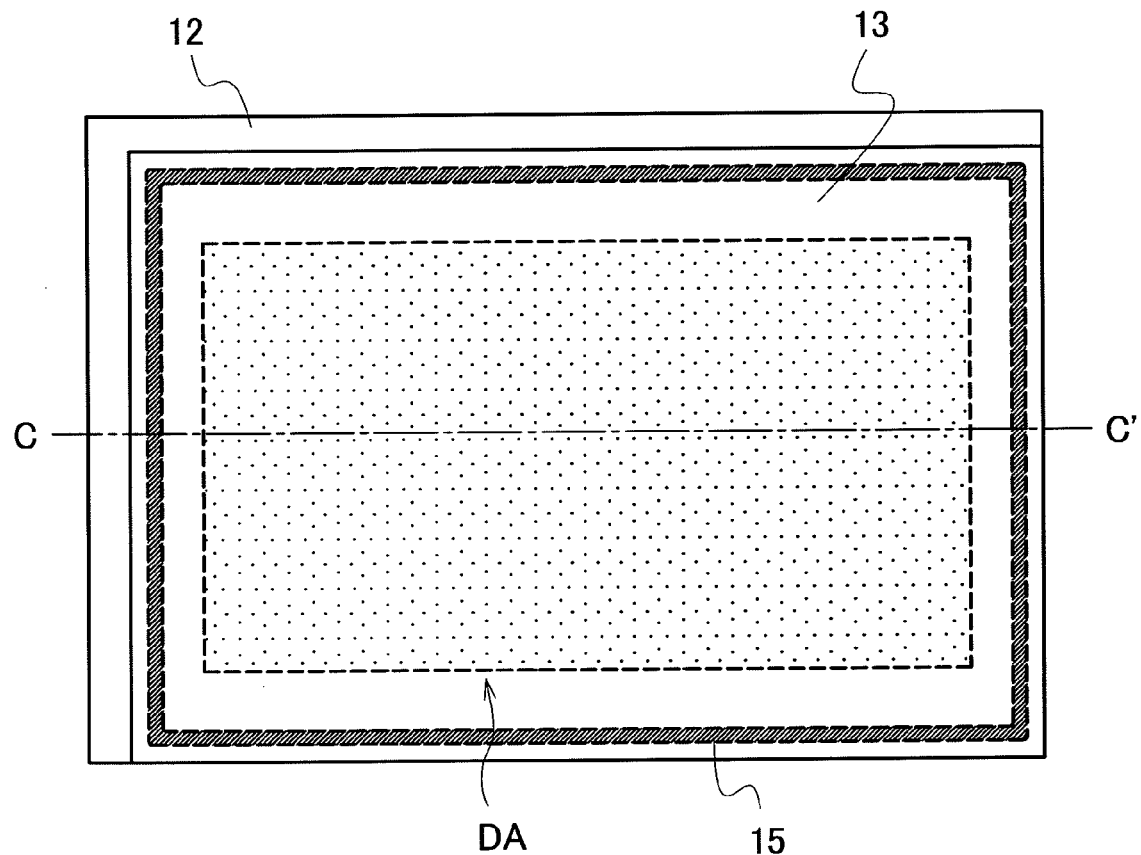
FIG. 3A is a schematic plan view showing one example of a schematic configuration of a liquid crystal display panel.
Figure 3B:
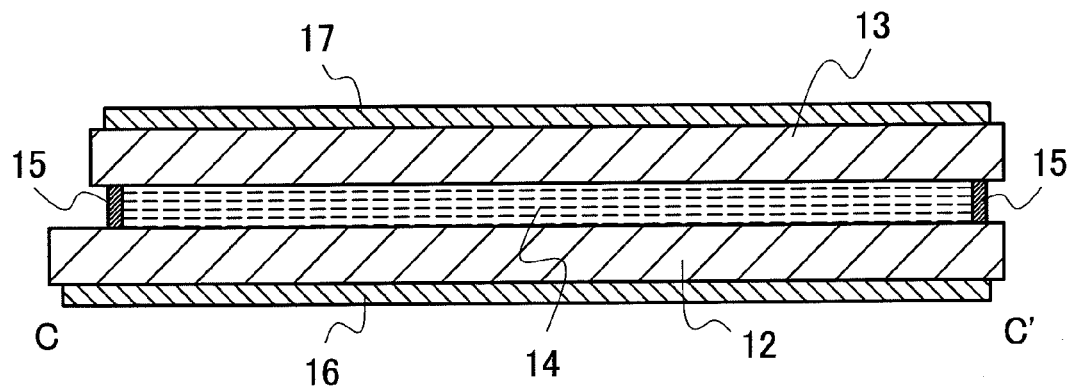
FIG. 3B is a schematic cross sectional view of the liquid crystal display panel taken along line C-C' in FIG. 3A.
Figure 3C:
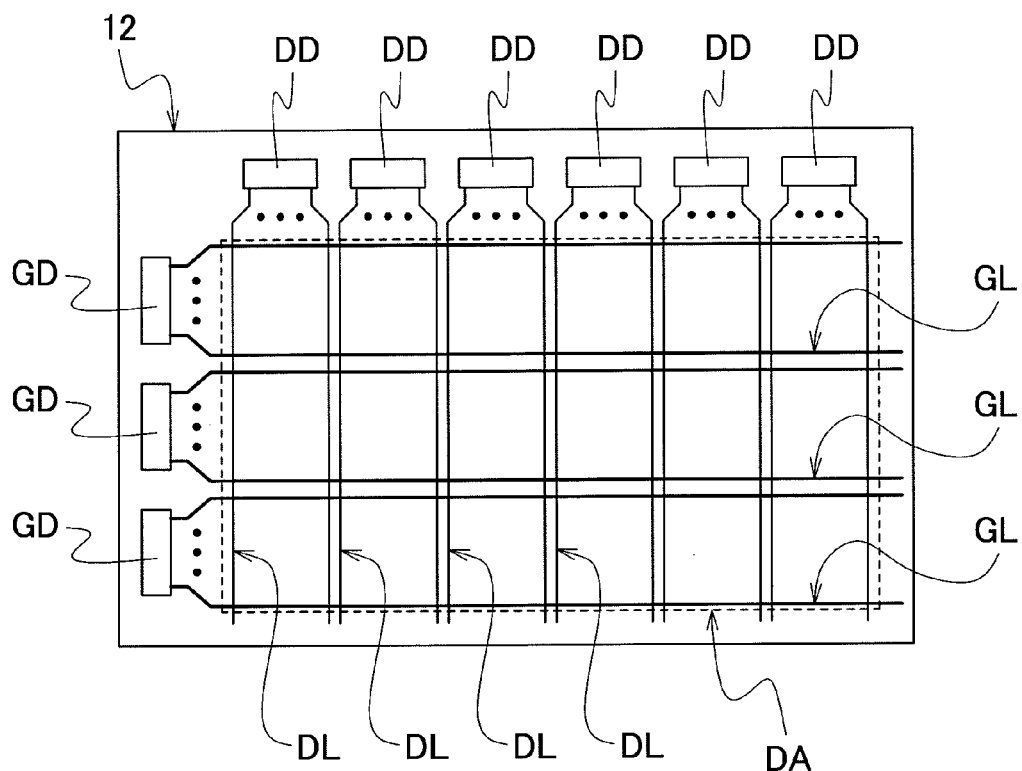
FIG. 3C is a schematic plan view showing one example of a schematic configuration of a TFT substrate of the liquid crystal display panel.
Figure 3D:
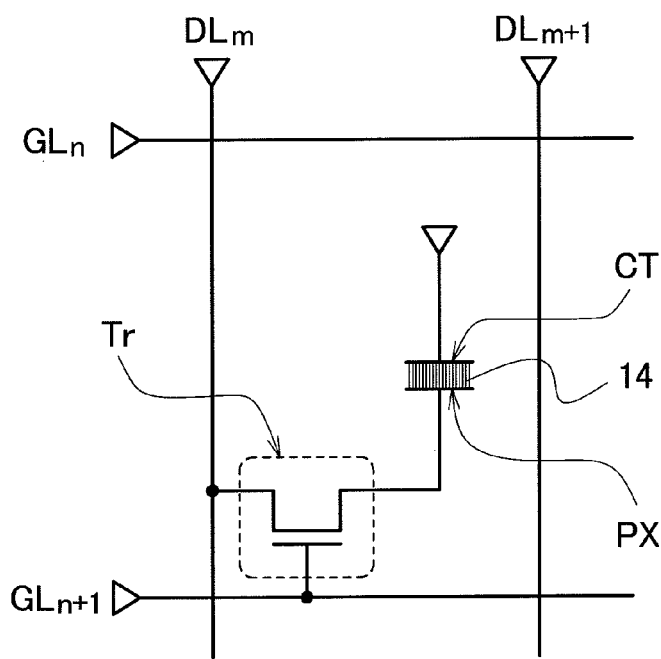
FIG. 3D is a schematic circuit diagram showing one example of an equivalent circuit diagram of one pixel of the liquid crystal display panel.

FIG. 3A is a schematic plan view showing one example of a schematic configuration of a liquid crystal display panel. FIG. 3B is a schematic cross sectional view of the liquid crystal display panel taken along line C-C' in FIG. 3A. FIG. 3C is a schematic plan view showing one example of a schematic configuration of a TFT substrate of the liquid crystal display panel. FIG. 3D is a schematic circuit diagram showing one example of an equivalent circuit diagram of one pixel of the liquid crystal display panel.

Figure 4A:
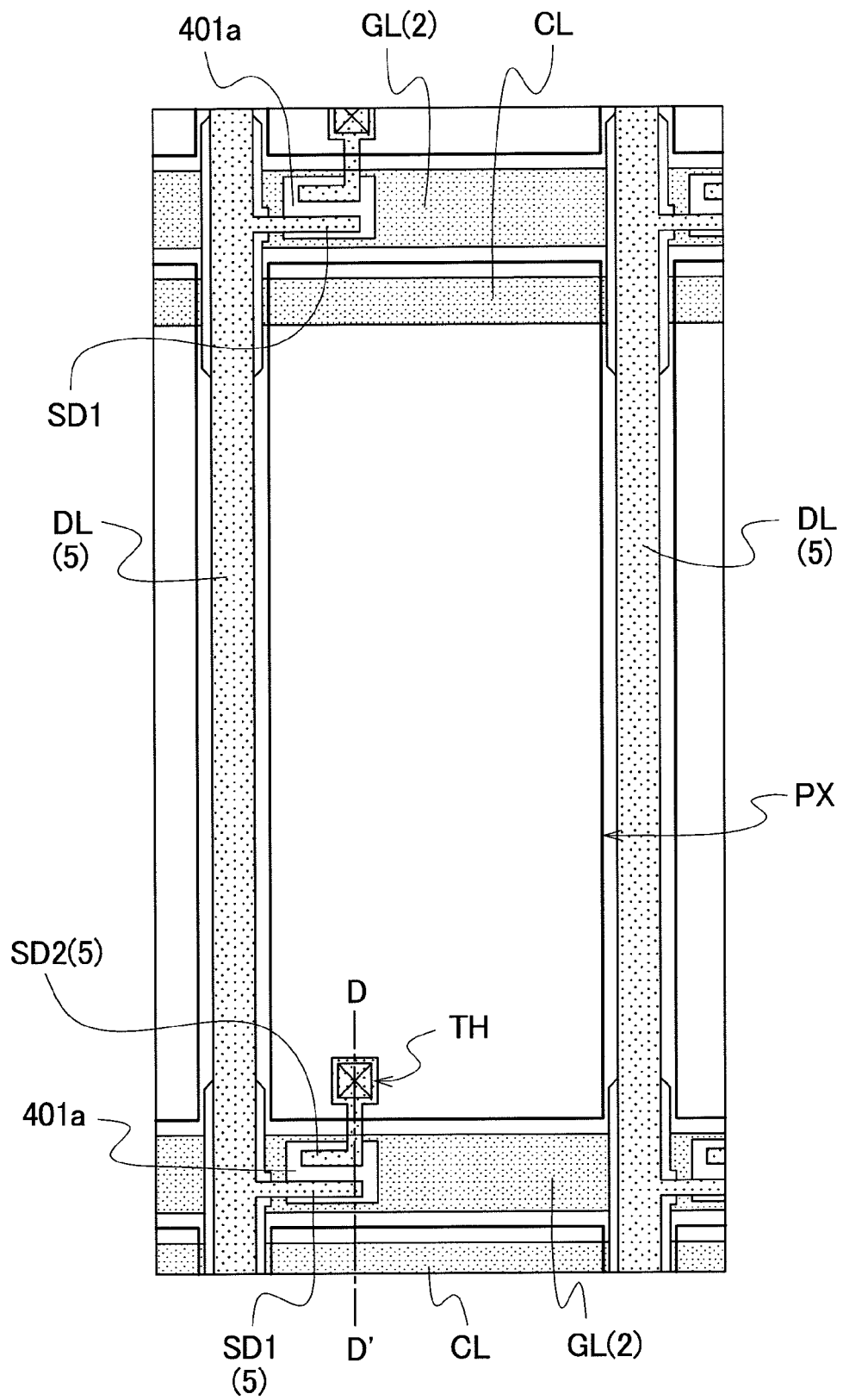
FIG. 4A is a schematic plan view showing one example of a schematic configuration of one pixel on a TFT substrate.
Figure 4B:
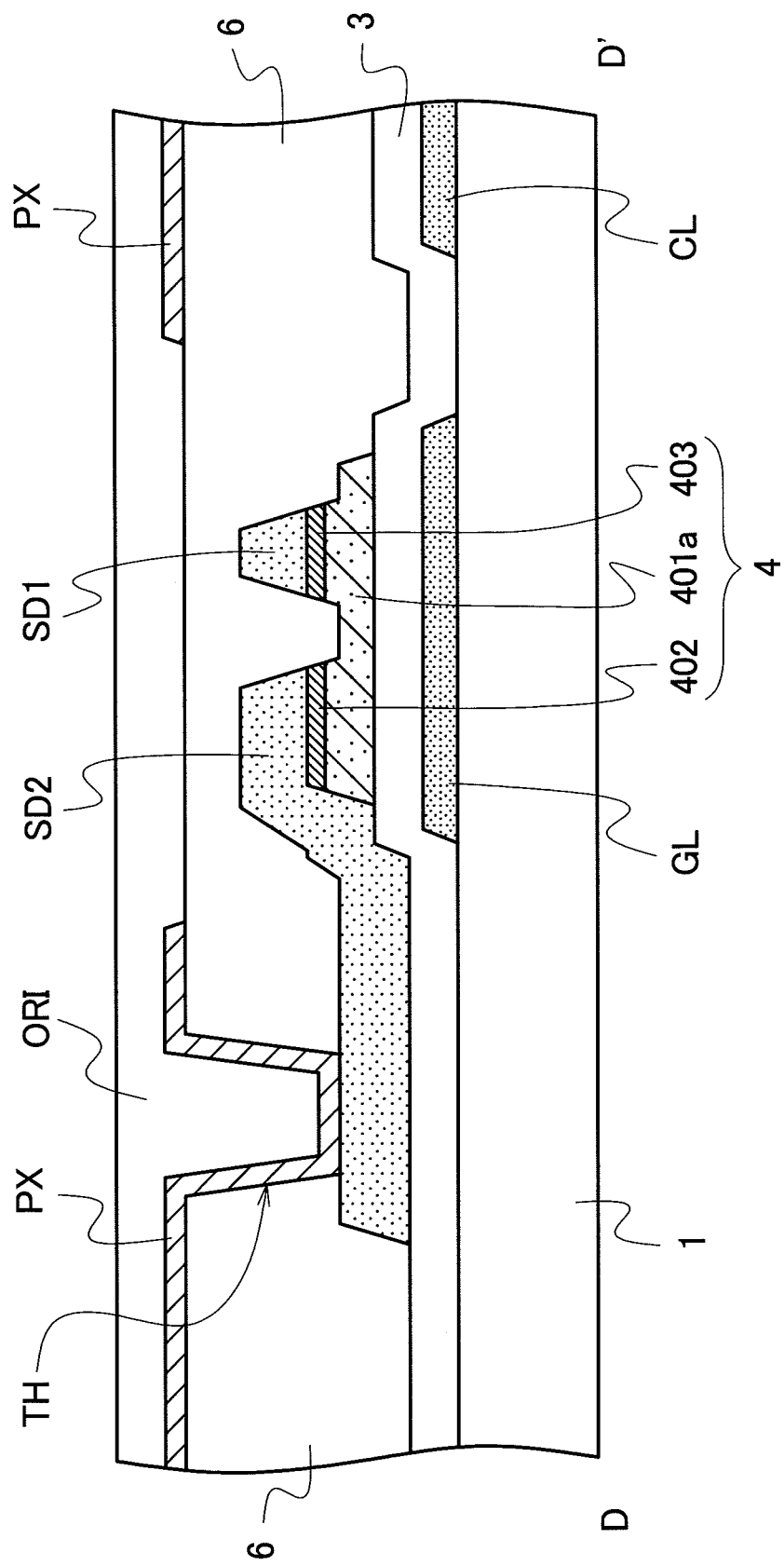
FIG. 4B is a schematic cross sectional view of the TFT substrate taken along line D-D' in FIG. 4A.

FIG. 4A is a schematic plan view showing one example of a schematic configuration of one pixel on a TFT substrate. FIG. 4B is a schematic cross sectional view of the TFT substrate taken along line D-D' in FIG. 4A.

The manufacturing method of the TFT element described in Example 1 can be applied to a manufacturing method of a TFT substrate in a liquid crystal display panel having a configuration as shown in FIGS. 3A to 3D.

The liquid crystal display panel is a display panel having a liquid crystal material 14 encapsulated between a TFT substrate 12 and a counter substrate 13 as shown in FIGS. 3A and 3B, for example. The TFT substrate 12 and the counter substrate 13 are bonded together with an annular sealing material 15 surrounding a display region DA.

In the case of a transmissive or semi-transmissive liquid crystal display panel used for a liquid crystal TV, a lower polarizer 16 and an upper polarizer 17 are respectively disposed on the faces of the TFT substrate 12 and counter substrate 13 facing the outside, that is, the rear faces of the faces facing the liquid crystal material 14. Depending on the kind of the liquid crystal display panel, single-layered or multiple-layered retardation plates are each disposed between the TFT substrate 12 and the lower polarizer 16, and between the counter substrate 13 and the upper polarizer 17 in some cases.

In the case of a reflective liquid crystal display panel, the lower polarizer 16 is not required in general, and only the upper polarizer 17, or the upper polarizer 17 and only a single-layered or multiple-layered retardation plate between the counter substrate 13 and the upper polarizer 17 is/are disposed.

In the TFT substrate 12 to which the manufacturing method of the TFT element of Example 1 can be applied, first drive circuits GD and second drive circuits DD are formed (incorporated) outside the display region DA as shown in FIG. 3C, for example. The first drive circuit GD operates similarly to a gate driver in the form of an IC chip in a conventional liquid crystal display device, mainly controlling a scanning signal applied to each of a plurality of scanning signal lines GL. The second drive circuit DD operates similarly to a data driver in the form of an IC chip in a conventional liquid crystal display device, mainly generating a video signal (gray scale voltage signal) applied to each of a plurality of video signal lines DL and controlling the timing of application.

The first drive circuit GD and the second drive circuit DD are each an integrated circuit that is formed of a TFT element, capacitor element, resistance element or the like formed above an insulating substrate such as a glass substrate, and must be operated at a high speed. Therefore, the TFT elements of the first drive circuit GD and second drive circuit DD each desirably include an active layer formed of a polycrystalline semiconductor.

The display region DA of the liquid crystal display device includes an assembly of a plurality of pixels, and the configuration of one pixel can be expressed by an equivalent circuit as shown in FIG. 3D, for example. That is, one pixel corresponds to a region surrounded by two adjacent scanning signal lines $GL_n$ and $GL_{n+1}$ and two adjacent video signal lines $DL_m$ and $DL_{m+1}$. In each pixel, a TFT element Tr functioning as an active element (switching element), a pixel electrode PX, and a counter electrode CT are arranged. In this case, the pixel electrode PX is connected to one video signal line $DL_m$ of the two adjacent video signal lines $DL_m$ and $DL_{m+1}$ via the TFT element Tr. In each pixel, the orientation of liquid crystal molecules in the liquid crystal material 14 is controlled based on the difference between the potential of the counter electrode CT and the potential of a gray scale voltage written from the video signal line $DL_m$ into the pixel electrode PX during the period when the TFT element Tr is turned ON, so that a gray scale (luminance) is expressed.

Also in this case, amorphous silicon is often used for the active layer of the TFT element Tr in each pixel although that varies depending on the kind of the liquid crystal display panel (application or size). The TFT element Tr in this case has generally the inverted staggered structure.

In the case where the TFT element Tr in each pixel is an a-TFT element of the inverted staggered structure, a planar layout configuration of one pixel on the TFT substrate 12 and a cross sectional configuration of the a-TFT element are as shown in FIGS. 4A and 4B, respectively, for example.

That is, the plurality of scanning signal lines GL having a function as a gate electrode of the TFT element Tr and a plurality of holding capacitance lines CL are formed on the surface of the insulating substrate 1, and the semiconductor layer 4 having the active layer 401a formed of the first amorphous silicon film is formed thereabove via the first insulating layer 3. The plurality of video signal lines DL, and a drain electrode SD1 and a source electrode SD2 of the TFT element Tr are also formed above the surface of the first insulating layer 3. In this case, the drain electrode SD1 is formed integrally with the video signal line DL, for example. The source electrode SD2 is connected to the pixel electrode PX formed on the second insulating layer 6 via a through hole TH. An alignment film ORI is formed above the second insulating layer 6.

In Example 1, the electrode integrated with the video signal line DL is referred to as the "drain electrode SD1", while the electrode connected to the pixel electrode PX is referred to as the "source electrode SD2". In an actual liquid crystal display panel, however, the source and drain are reversed based on the difference between the potential of the pixel electrode PX and the potential of a video signal applied to the video signal line DL, so that the electrode integrated with the video signal line DL serves as a source electrode, and the electrode connected to the pixel electrode PX serves as a drain electrode, in some cases.

In the case where, for each pixel in the display region DA, the first drive circuit GD and the second drive circuit DD are formed outside the display region DA in the TFT substrate having a configuration as shown in FIGS. 4A and 4B, for example, when the TFT elements of the first drive circuit GD and second drive circuit DD are p-TFT elements as shown in FIGS. 1C and 1D, for example, the TFT substrate 12 in which the first drive circuit GD and the second drive circuit DD are formed (incorporated) can be easily manufactured by utilizing a conventional manufacturing process of a TFT element.

Also in this case, in a manufacturing process of the TFT substrate 12, the steps up to the step of forming (depositing) the second insulating layer 6 are performed by the procedure described in Example 1, whereby the operating characteristics of the p-TFT elements in the first drive circuit GD and the second drive circuit DD can be easily prevented from lowering. Therefore, the operating characteristics of the first drive circuit GD and second drive circuit DD can be enhanced.

The configuration of the a-TFT element shown in FIGS. 4A and 4B is one configuration example of an active element (TFT element Tr) in the TFT substrate 12 and not limited thereto. For example, it is apparent that the planar layout of the a-TFT element can be different.

Also regarding the first drive circuit GD and second drive circuit DD of the TFT substrate 12, the planar layout thereof is not limited to one as shown in FIG. 1C, for example. It is apparent that another planar layout is applicable.

EXAMPLE 2

FIGS. 5A to 5H are schematic views for explaining a manufacturing method of a TFT element of Example 2 according to the invention.

Figure 5B:
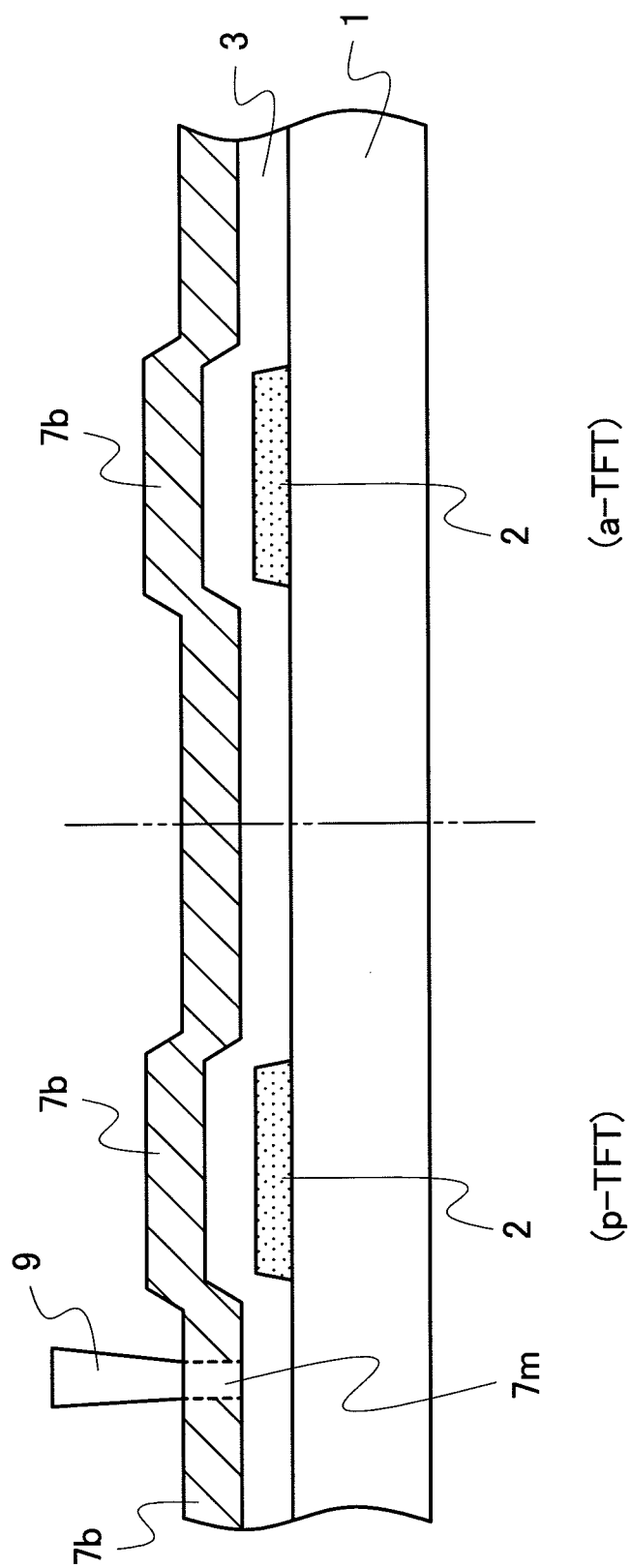
FIG. 5B is a schematic cross sectional view of the step of partially polycrystallizing the first amorphous silicon film in the manufacturing method of the TFT element of Example 2.
Figure 5F:
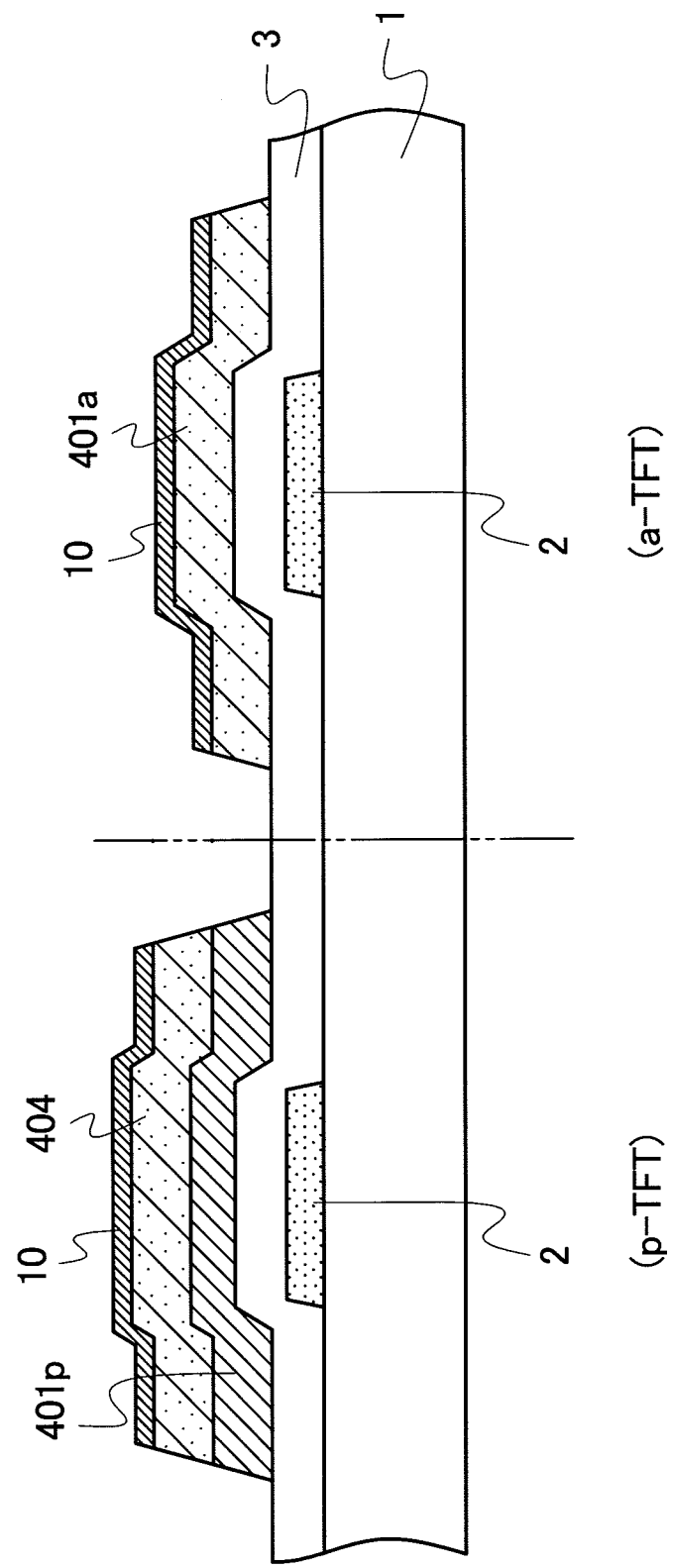
FIG. 5F is a schematic cross sectional view after the step of etching the first amorphous silicon film, the second amorphous silicon film, and the third amorphous silicon film in the manufacturing method of the TFT element of Example 2.
Figure 5H:
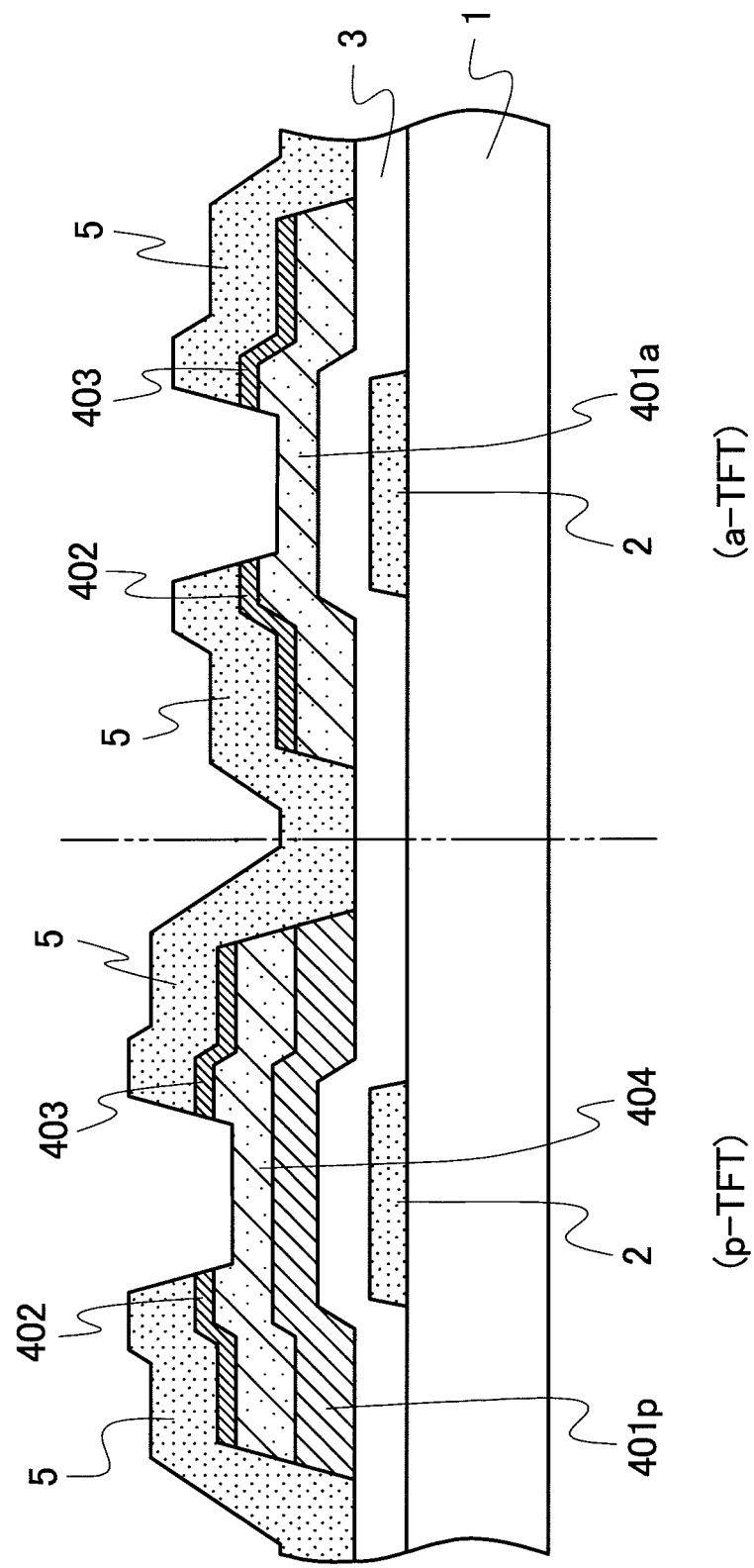
FIG. 5H is a schematic cross sectional view after the step of separating the second amorphous silicon film in the manufacturing method of the TFT element of Example 2.
Figure 6C:
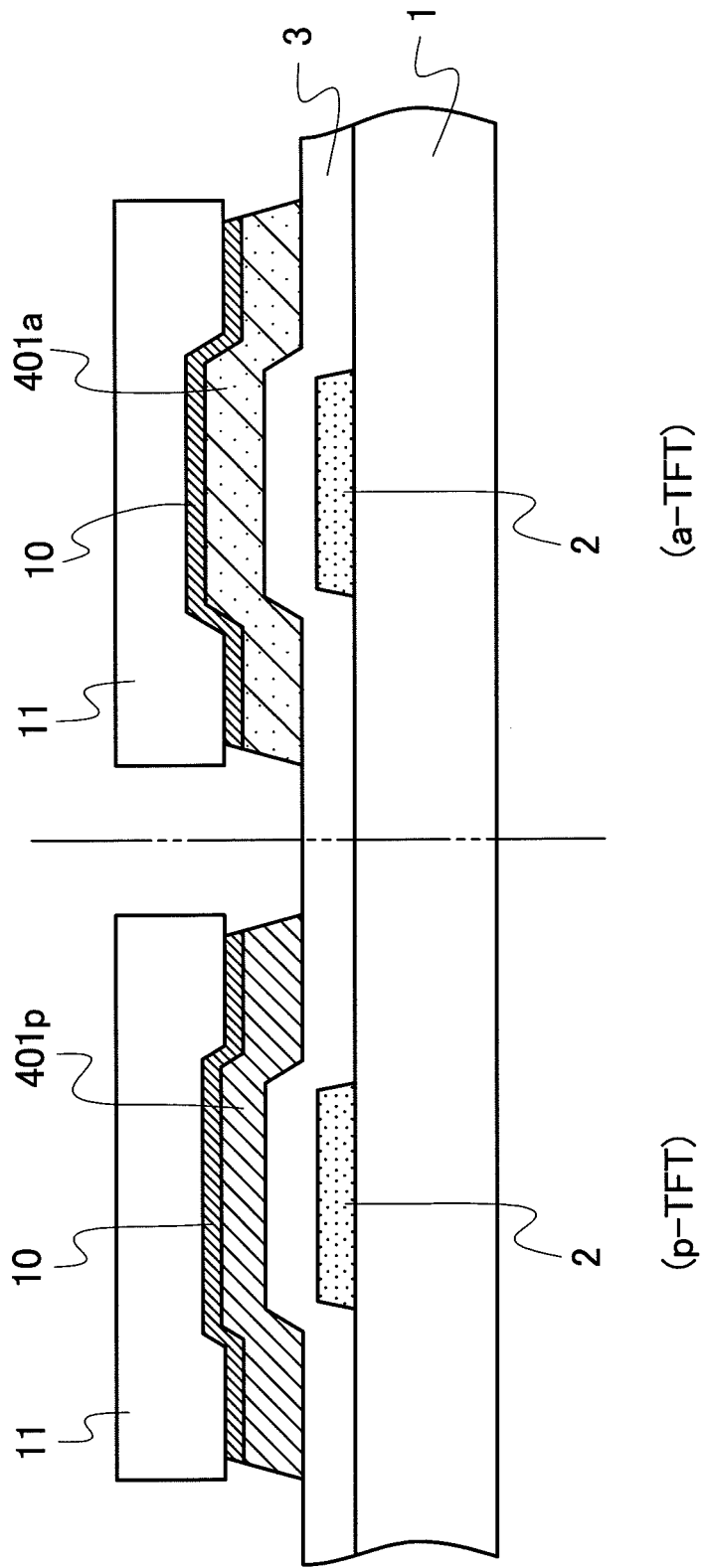
FIG. 6C is a schematic cross sectional view after the step of etching the first amorphous silicon film and the second amorphous silicon film in the conventional manufacturing method.
Figure 6E:
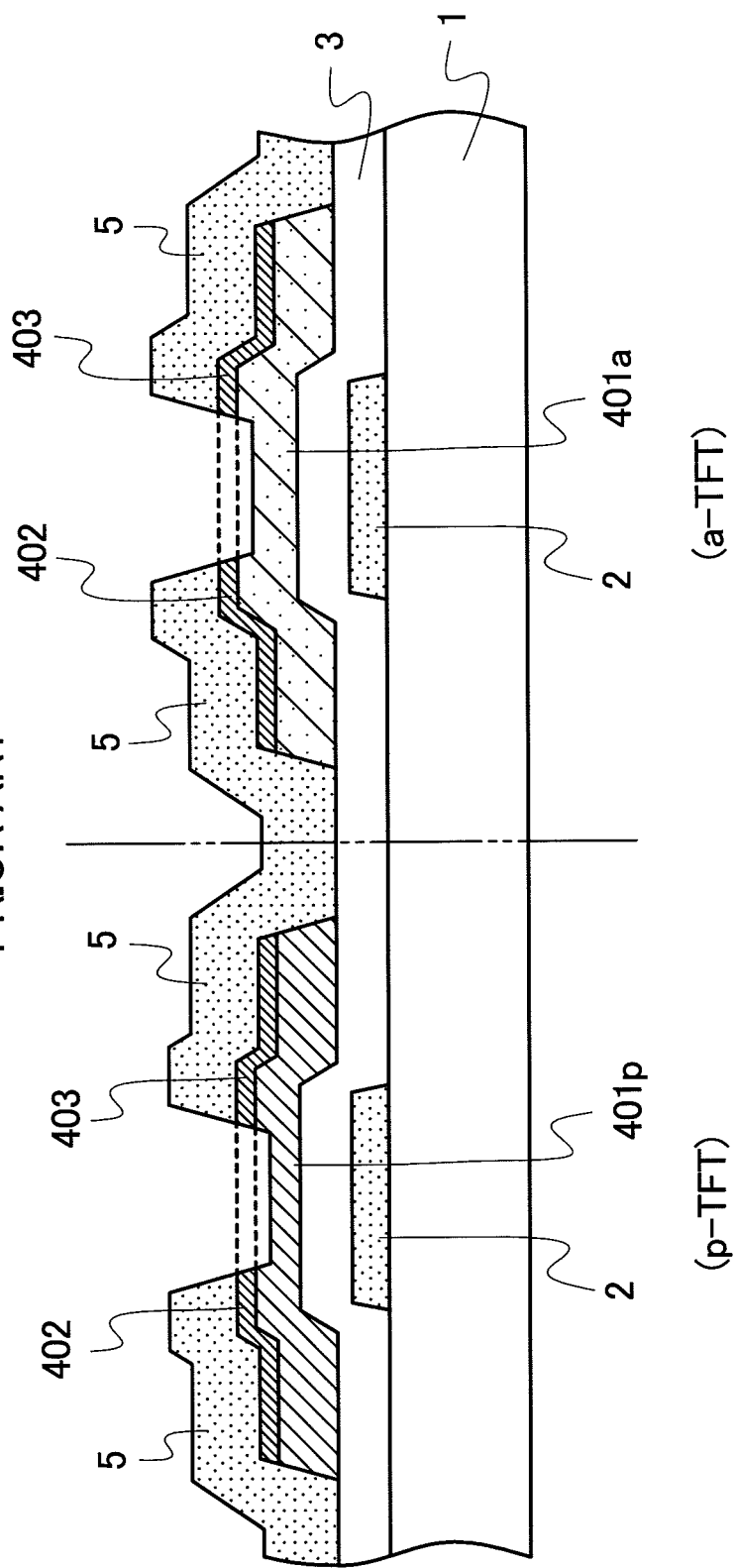
FIG. 6E is a schematic cross sectional view after the step of separating the second amorphous silicon film in the conventional manufacturing method.

FIG. 5A is a schematic cross sectional view after the step of dehydrogenating the first amorphous silicon film in the manufacturing method of the TFT element of Example 2. FIG. 5B is a schematic cross sectional view of the step of partially polycrystallizing the first amorphous silicon film in the manufacturing method of the TFT element of Example 2. FIG. 5C is a schematic cross sectional view after the step of partially polycrystallizing the first amorphous silicon film in the manufacturing method of the TFT element of Example 2. FIG. 5D is a schematic cross sectional view after the step of removing an amorphous portion of the first amorphous silicon film in the manufacturing method of the TFT element of Example 2. FIG. 5E is a schematic cross sectional view after the step of forming a third amorphous silicon film and the second amorphous silicon film in the manufacturing method of the TFT element of Example 2. FIG. 5F is a schematic cross sectional view after the step of etching the first amorphous silicon film, the second amorphous silicon film, and the third amorphous silicon film in the manufacturing method of the TFT element of Example 2. FIG. 5G is a schematic cross sectional view after the step of forming a source electrode and a drain electrode in the manufacturing method of the TFT element of Example 2. FIG. 5H is a schematic cross sectional view after the step of separating the second amorphous silicon film in the manufacturing method of the TFT element of Example 2.

Each of FIGS. 5A to 5H shows the forming procedure of an a-TFT element on the right side of the two-dot chain line while showing the forming procedure of a p-TFT element on the left side of the two-dot chain line.

In Example 1, in the course of simultaneously forming the a-TFT element and the p-TFT element on the surface of the insulating substrate 1, the laser 8 is used to dehydrogenate the first amorphous silicon film 7a only in the region for forming the p-TFT element as shown in FIGS. 2B and 2C, for example. However, in the case of simultaneously forming the a-TFT element and the p-TFT element on the surface of the insulating substrate 1, it is also possible to form the active layer 401a of the a-TFT element by dehydrogenating the entire first amorphous silicon film 7a and forming the third amorphous silicon film different from the first amorphous silicon film 7a.

In the manufacturing method of the TFT element of Example 2, the gate electrode 2, the first insulating layer 3, and the first amorphous silicon film 7a are formed in this order on the surface of the insulating substrate 1 as shown in FIG. 2A, for example.

Next, the insulating substrate 1 formed with up to the first amorphous silicon film 7a is heated in a drying furnace, for example, so that the entire first amorphous silicon film 7a is converted to a dehydrogenated amorphous silicon film 7b as shown in FIG. 5A.

Next, as shown in FIG. 5B, for example, the dehydrogenated amorphous silicon film 7b in the region for forming the p-TFT element is irradiated with the laser 9, thereby being converted to the polycrystalline silicon 7p. The laser 9 irradiated at this time is a continuous-wave laser at a wavelength of 532 nm, for example. The silicon 7m that is melted by the irradiation of the laser 9 is crystallized into the polycrystalline silicon 7p. Also in this case, for example, the laser 9 is irradiated while moving (scanning) in the channel length direction of the p-TFT element at a predetermined speed, so that polycrystalline silicon mainly includes a band-shaped crystal that extends long in one direction (channel length direction) as shown in FIG. 1C, for example.

In the case where the silicon 7m that is melted by the irradiation of the continuous-wave laser 9 is crystallized into the polycrystalline silicon 7p as described above, the thickness of the polycrystalline silicon 7p above the gate electrode 2 of the p-TFT element is smaller than that of the dehydrogenated amorphous silicon film 7b above the gate electrode 2 of the a-TFT element as shown in FIG. 5C, for example. In the case of the manufacturing method of Example 2, however, the thickness of the polycrystalline silicon 7p above the gate electrode 2 of the p-TFT element can be made 60 nm or more (about 70 nm, for example) because the thickness of the first amorphous silicon film 7a that is formed (deposited) first is 75 nm or more.

In the manufacturing method of the TFT element of Example 2, the first amorphous silicon film 7a in the region for forming the a-TFT element is converted to the dehydrogenated amorphous silicon film 7b, which is unsuitable for the active layer 401a of the a-TFT element. Therefore, next, the dehydrogenated amorphous silicon film 7b is removed as shown in FIG. 5D, for example.

Next, as shown in FIG. 5E, for example, a third amorphous silicon film 7a' that can be used for the active layer 401a of the a-TFT element, and the second amorphous silicon film 10 are formed. The third amorphous silicon film 7a' can be formed (deposited) in the same manner as the first amorphous silicon film 7a. The second amorphous silicon film 10 is used as the source contact layer 402 and the drain contact layer 403. Therefore, in the case where the a-TFT element and the p-TFT element are n-channel MOS transistors, the second amorphous silicon film 10 is formed by depositing n-type amorphous silicon at a high concentration, for example.

FIG. 5E shows the case where the third amorphous silicon film 7a' is formed (deposited) to the same thickness as the first amorphous silicon film 7a. However, the thickness is not limited thereto. It is apparent that the third amorphous silicon film 7a' can be formed (deposited) to any thickness.

Next, as shown in FIG. 5F, for example, the second amorphous silicon film 10, the third amorphous silicon film 7a', and the polycrystalline silicon 7p in the region for forming the p-TFT element are etched to form the active layer 401a of the a-TFT element and the active layer 401p of the p-TFT element. A pseudo active layer 404 formed of the third amorphous silicon film 7a' is left on the active layer 401p of the p-TFT element. The second amorphous silicon films 10 left on the active layers 401a and 401p (pseudo active layer 404) of the respective TFT elements are each separated into the source contact layer 402 and the drain contact layer 403 in the subsequent step.

Next, after a conductive film covering the active layers 401a and 401p of the respective TFT elements each having the second amorphous silicon film 10 is formed above the first insulating layer 3, the conductive film is etched to form the wirings 5 as shown in FIG. 5G, for example. In this case, among the wirings 5, one of two wirings 5 that ride on one active layer 401a serves as the source electrode of the a-TFT element, for example, while the other serves as the drain electrode of the a-TFT element. Similarly, one of two wirings 5 that ride on one active layer 401p serves as the source electrode of the p-TFT element, for example, while the other serves as the drain electrode of the p-TFT element.

Next, for example, the second amorphous silicon films 10 are etched using the wirings 5 as a mask, so that the second amorphous silicon films 10 on the active layers 401a and 401p are each separated into the source contact layer 402 and the drain contact layer 403 as shown in FIG. 5H.

In this case, when a channel protection layer is not present in the second amorphous silicon films 10 at portions to be removed in the step of separating the second amorphous silicon film 10 into the source contact layer 402 and the drain contact layer 403, the channel region (region above the gate electrode 2) of the active layer 401a is also etched in the a-TFT element as shown in FIG. 5H. In the p-TFT element, however, because of the presence of the pseudo active layer 404 formed of the third amorphous silicon film 7a' on the active layer 401p formed of polycrystalline silicon, the channel region of the active layer 401p is not etched. Accordingly, a sufficient thickness can be ensured for the channel portion of the active layer 401p of the p-TFT element, whereby the operating characteristics of the p-TFT element can be prevented from lowering.

The pseudo active layer 404 of the p-TFT element can function as an active layer of a TFT element because it is formed of the third amorphous silicon film 7a'. In the case of the p-TFT element of the inverted staggered structure, however, when the p-TFT element is turned ON, a channel is formed in the active layer 401p close to the gate electrode 2. Therefore, the current (carrier) flowing between the source and drain mostly flows through the active layer 401p. Accordingly, even with a structure having the pseudo active layer 404, operating characteristics equivalent to that of the p-TFT element in Example 1 can be obtained.

Thereafter, the second insulating layer 6 or the like protecting the TFT elements is formed. The second insulating layer 6 may be a single insulating layer or a stacked layer of two or more kinds of insulating layers.

As described above, according to the manufacturing method of the TFT element of Example 2, when the plurality of a-TFT elements and plurality of p-TFT elements of the inverted staggered structure are formed on the surface of one insulating substrate, they can be effectively formed by utilizing a conventional manufacturing process of the a-TFT element of the inverted staggered structure.

Further, according to the manufacturing method of Example 2, even when the thickness of the first amorphous silicon film 7a used for the formation of the active layer 401p of the p-TFT element is 75 nm or more, for example, the active layer 401p (polycrystalline silicon) of the p-TFT element has good crystallinity, whereby the operating characteristics of the p-TFT element can be easily prevented from lowering.

Still further, according to the manufacturing method of Example 2, the thickness of the active layer 401a of the a-TFT element can also be made great, whereby the operating characteristics (mobility of carriers, for example) of the a-TFT element can be easily enhanced.

In addition, according to the manufacturing method of Example 2, the active layer 401p of the p-TFT element is formed of the polycrystalline silicon 7p that is obtained by polycrystallizing the first amorphous silicon film 7a, and the active layer 401a of the a-TFT element is formed of the third amorphous silicon film 7a'. Therefore, the degree of freedom of choice occurs in the relationship between the thickness of the active layer 401p of the p-TFT element and the thickness of the active layer 401a of the a-TFT element.

It is apparent that the manufacturing method of Example 2 can be applied to a manufacturing method of the TFT substrate 12 in the liquid crystal display panel having the configuration as shown in FIGS. 3A to 3D, 4A, and 4B.

Although the invention has been specifically described based on the examples, the invention is not limited to the examples. It is apparent that the invention can be variously modified within the range not departing from the gist thereof.

For example, it is apparent that the manufacturing method of the TFT element described in Examples 1 or 2 can be applied not only to a TFT substrate of a liquid crystal display panel having the first drive circuit GD and the second drive circuit DD but also to a substrate having a configuration similar to that of the TFT substrate (TFT substrate of an organic electroluminescent display panel, for example). Further, the manufacturing method can be applied not only to a TFT substrate of a display panel but also to the manufacture of other integrated circuit device.

What is claimed is:

1. A display device comprising a TFT substrate in which a plurality of first TFT elements each having an active layer comprised of an amorphous semiconductor and a plurality of second TFT elements each having an active layer comprised of a polycrystalline semiconductor are disposed on a surface of an insulating substrate, wherein the first TFT element and the second TFT element each include:
    an inverted staggered structure including a gate electrode, a gate insulating film, and the active layer stacked in this order on the surface of the insulating substrate and
    a source electrode and a drain electrode both connected to the active layer via a contact layer above the active layer as viewed from the insulating substrate, wherein the active layer comprised of the polycrystalline semiconductor of the second TFT element has a thickness of 60 nm or more in a position where the contact layer is stacked.

2. The display device according to claim 1, wherein the active layer of the second TFT element comprises a polycrystalline semiconductor mainly including a band-shaped crystal that extends lengthwise in a channel length direction of the second TFT element.

3. The display device according to the claim 1, wherein the plurality of first TFT elements are disposed in a matrix form in a display region on the surface of the insulating substrate, and
the plurality of second TFT elements are disposed outside the display region on the surface of the insulating substrate.

4. The display device according to claim 1, wherein the active layer comprised of the amorphous semiconductor of the first TFT element has a thickness of 75 nm or more.

5. A display device comprising a TFT substrate in which a plurality of first TFT elements each having an active layer comprised of an amorphous semiconductor and a plurality of second TFT elements each having an active layer comprised of a polycrystalline semiconductor are disposed on a surface of an insulating substrate, wherein the first TFT element and the second TFT element each include:
an inverted staggered structure including a gate electrode, a gate insulating film, and the active layer stacked in this order on the surface of the insulating substrate and
a source electrode and a drain electrode both connected to the active layer via a contact layer above the active layer as viewed from the insulating substrate,
wherein the active layer of the second TFT element comprises a first active layer formed of a polycrystalline semiconductor and a second active layer formed of an amorphous semiconductor stacked in this order on the gate insulating film as viewed from the insulating substrate, and
the first active layer formed of the polycrystalline semiconductor has a thickness of 60 nm or more in a portion positioned above the gate electrode as viewed from the insulating substrate.

6. The display device according to claim 5, wherein the first active layer of the second TFT element comprises a polycrystalline semiconductor mainly including a band-shaped crystal that extends lengthwise in a channel length direction of the second TFT element.

7. The display device according to claim 5, wherein the active layer of the first TFT element is formed of only an amorphous semiconductor, and
the active layer of the first TFT element has substantially the same thickness as the thickness of the second active layer of the second TFT element.

8. The display device according to claim 5, wherein the active layer comprised of the amorphous semiconductor of the first TFT element has a thickness of 75 nm or more.

* * * * *